(12) United States Patent
Kang et al.

(10) Patent No.: US 12,538,526 B2
(45) Date of Patent: Jan. 27, 2026

(54) THIN FILM TRANSISTOR AND DISPLAY DEVICE COMPRISING THE SAME

(71) Applicant: LG Display Co., Ltd., Seoul (KR)

(72) Inventors: Min-Gu Kang, Paju-si (KR); Younghyun Ko, Paju-si (KR); Seungchan Choi, Paju-si (KR); Jaeman Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 585 days.

(21) Appl. No.: 17/963,101

(22) Filed: Oct. 10, 2022

(65) Prior Publication Data

US 2023/0111218 A1   Apr. 13, 2023

(30) Foreign Application Priority Data

Oct. 12, 2021   (KR) .................. 10-2021-0135019

(51) Int. Cl.
| | | |
|---|---|---|
| *H10D 30/67* | (2025.01) | |
| *H10D 86/40* | (2025.01) | |
| *H10D 86/60* | (2025.01) | |
| *H10K 59/121* | (2023.01) | |

(52) U.S. Cl.
CPC ..... *H10D 30/6757* (2025.01); *H10D 30/6755* (2025.01); *H10D 86/423* (2025.01); *H10D 86/60* (2025.01); *H10K 59/1213* (2023.02)

(58) Field of Classification Search
CPC .......... H10D 30/6757; H10D 30/6715; H10D 30/67; H10D 30/6755; H10D 30/673; H10D 86/423; H10D 86/40; H10D 86/60; H10D 64/519; H10D 64/27; H10D 64/517; H10D 30/6708; H10K 59/121; H10K 59/12; H10K 59/1213; H10K 59/126
See application file for complete search history.

(56) References Cited

U.S. PATENT DOCUMENTS

| | | | |
|---|---|---|---|
| 7,550,331 B2 | 6/2009 | Lee et al. | |
| 8,247,812 B2 * | 8/2012 | Sakata | H10D 86/423 257/E33.013 |
| 10,192,957 B2 | 1/2019 | Baeck et al. | |

(Continued)

FOREIGN PATENT DOCUMENTS

| | | |
|---|---|---|
| CN | 109841687 A | 6/2019 |
| JP | H10270699 A | 10/1998 |

(Continued)

*Primary Examiner* — Nikolay K Yushin
(74) *Attorney, Agent, or Firm* — Seed Intellectual Property Law Group LLP

(57) ABSTRACT

A thin film transistor and a display device comprising the same are provided. The thin film transistor comprises an active layer, and a gate electrode at least partially overlapped with the active layer, wherein the active layer includes a channel portion overlapped with the gate electrode, a first connection portion that is in contact with one side of the channel portion, and a second connection portion that is in contact with the other side of the channel portion, the channel portion includes a first channel area and a second channel area, each of the first channel area and the second channel area is extended from the first connection portion to the second connection portion, and a length of the first channel area is shorter than that of the second channel area.

15 Claims, 18 Drawing Sheets

(56) References Cited

U.S. PATENT DOCUMENTS

| | | | |
|---|---|---|---|
| 10,304,875 B2 * | 5/2019 | Lou | H10D 99/00 |
| 10,580,904 B2 | 3/2020 | Lee | |
| 11,495,692 B2 * | 11/2022 | Jang | H10D 86/423 |
| 2007/0040177 A1 | 2/2007 | Lee et al. | |
| 2010/0207117 A1 * | 8/2010 | Sakata | H10D 30/6755 |
| | | | 257/E21.414 |
| 2017/0221925 A1 * | 8/2017 | Lou | H10D 86/423 |
| 2018/0166585 A1 | 6/2018 | Takechi | |
| 2019/0074377 A1 | 3/2019 | Park et al. | |
| 2019/0097059 A1 | 3/2019 | Kikuchi et al. | |
| 2019/0157464 A1 | 5/2019 | Shin | |
| 2020/0212221 A1 | 7/2020 | Baeck et al. | |
| 2021/0202754 A1 * | 7/2021 | Jang | H10D 30/6713 |

FOREIGN PATENT DOCUMENTS

| | | |
|---|---|---|
| JP | 2007123732 A | 5/2007 |
| JP | 2010039413 A | 2/2010 |
| JP | 2017531322 A | 10/2017 |
| JP | 2018098364 A | 6/2018 |
| JP | 2019067791 A | 4/2019 |
| KR | 20050105661 A | 11/2005 |
| KR | 20160002352 A | 1/2016 |
| KR | 20180079036 A | 7/2018 |
| KR | 20180127598 A | 11/2018 |
| TW | I482226 B | 4/2015 |

* cited by examiner

THIN FILM TRANSISTOR AND DISPLAY DEVICE COMPRISING THE SAME

CROSS-REFERENCE TO RELATED APPLICATIONS

This application claims the benefit of priority of the Korean Patent Application No. 10-2021-0135019 filed on Oct. 12, 2021.

BACKGROUND

Technical Field

The present disclosure relates to a thin film transistor that may improve an s-factor and an ON-current at the same time and a display device comprising the same.

Description of the Related Art

Transistors are widely used as switching devices or driving devices in the field of electronic devices. In particular, since a thin film transistor can be fabricated on a glass substrate or a plastic substrate, the thin film transistor is widely used as a switching device of a display device such as a liquid crystal display device or an organic light emitting element.

The display device may include, for example, a switching thin film transistor and a driving thin film transistor. It is favorable that the driving thin film transistor has a large s-factor to represent a gray scale.

Thin film transistors generally have a small s-factor to make sure of on-off characteristics. When such thin film transistors are applied to the driving thin film transistor of the display device, it is difficult to represent a gray scale of the display device.

Therefore, a thin film transistor having a large s-factor are required to easily represent a gray scale by being used for the driving thin film transistor of the display device. Also, even if the thin film transistor has a large s-factor, it is required that the thin film transistor should have excellent current characteristics in an ON-state.

BRIEF SUMMARY

The present disclosure provides a thin film transistor that has a large s-factor, and has excellent current characteristics in an ON-state.

The present disclosure provides a thin film transistor that as a large s-factor and has a large current value in an ON-state.

The present disclosure provides a thin film transistor designed such that a first channel area and a second channel area of a channel portion have their respective lengths different from each other to improve an s-factor and an ON-current at the same time.

The present disclosure provides a thin film transistor designed such that a second channel area of a channel portion has a length greater than that of a first channel area thereof to increase an s-factor.

The present disclosure provides a thin film transistor designed such that a first channel area of a channel portion has a length smaller than that of a second channel area thereof to have excellent ON-current characteristics.

The present disclosure provides a display device that has an excellent gray scale representation capability and excellent current characteristics by including a driving thin film transistor having a large s-factor and large ON-current characteristics.

In addition to the technical features and benefits of the present disclosure as mentioned herein, additional technical benefits and features of the present disclosure will be clearly understood by those skilled in the art from the description herein of the present disclosure.

In accordance with an aspect of the present disclosure, a thin film transistor comprises an active layer, and a gate electrode at least partially overlapped with the active layer, wherein the active layer includes a channel portion overlapped with the gate electrode, a first connection portion that is in contact with a side of the channel portion, and a second connection portion that is in contact with the other side of the channel portion, wherein the channel portion includes a first channel area and a second channel area, each of the first channel area and the second channel area is extended from the first connection portion to the second connection portion, and a length of the first channel area is shorter than that of the second channel area.

A width the gate electrode overlapped with the first channel area may be smaller than a width of the gate electrode overlapped with the second channel area.

The gate electrode overlapped with the first channel area and the gate electrode overlapped with the second channel area may be integrally formed.

The gate electrode may have a width that is changed in a stepwise manner at a boundary between the first channel area and the second channel area.

The gate electrode may have a width that is changed in stepwise manner between the first channel area and the second channel area.

The gate electrode may have a width that is gradually changed along a direction from the first channel area to the second channel area.

The active layer may include a first active layer including the first channel area, and a second active layer including the second channel area.

The first active layer and the second active layer may be disposed in the same layer, and may be spaced apart from each other.

The first active layer and the second active layer may be spaced apart from each other in an area overlapping with the gate electrode.

The active layer may be disposed to overlap the gate electrode and to surround a vacant area in a plan view.

The active layer may not be disposed in the vacant area.

The active layer may include an oxide semiconductor material.

The oxide semiconductor material may include at least one of an IZO(InZnO)-based, an IGO(InGaO)-based, an ITO(InSnO)-based, an IGZO(InGaZnO)-based, an IGZTO (InGaZnSnO)-based, a GZTO(GaZnSnO)-based, a GZO (GaZnO)-based, an ITZO (InSnZnO)-based or a FIZO(FeInZnO)-based oxide semiconductor material.

The active layer may include a first oxide semiconductor layer, and a second oxide semiconductor layer on the first oxide semiconductor layer.

The active layer may further include a third oxide semiconductor layer on the second oxide semiconductor layer.

In accordance with another aspect of the present disclosure, a display device comprises the thin film transistor described herein.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1A:
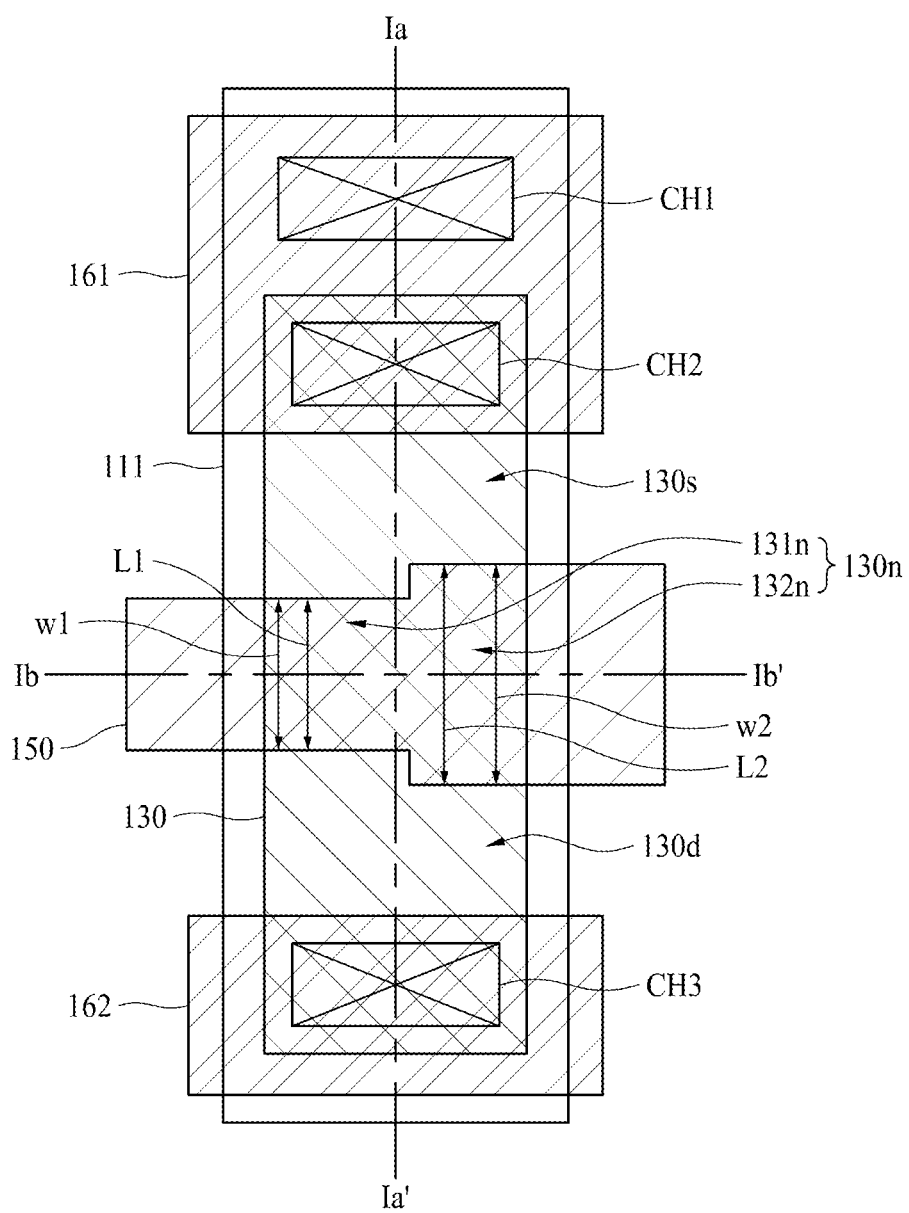
FIG. 1A is a plan view illustrating a thin film transistor according to an embodiment of the present disclosure.

Advantages and features of the present disclosure, and implementation methods thereof will be clarified through following embodiments described with reference to the accompanying drawings. These embodiments are provided so that this disclosure will be thorough and complete, and will fully convey the scope of the present disclosure to those skilled in the art. Further, the present disclosure is only defined by the scope of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~,' 'below~,' and 'next to~,' one or more portions may be arranged between two other portions unless 'just' or 'direct' is used.

Spatially relative terms such as "below," "beneath," "lower," "above," and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below," or "beneath" another device may be arranged "above" another device. Therefore, an example term "below or beneath" may include "below or beneath" and "above" orientations. Likewise, an example term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from one or more of the first item, the second item, and the third item as well as one or more of the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

Figure 1B:
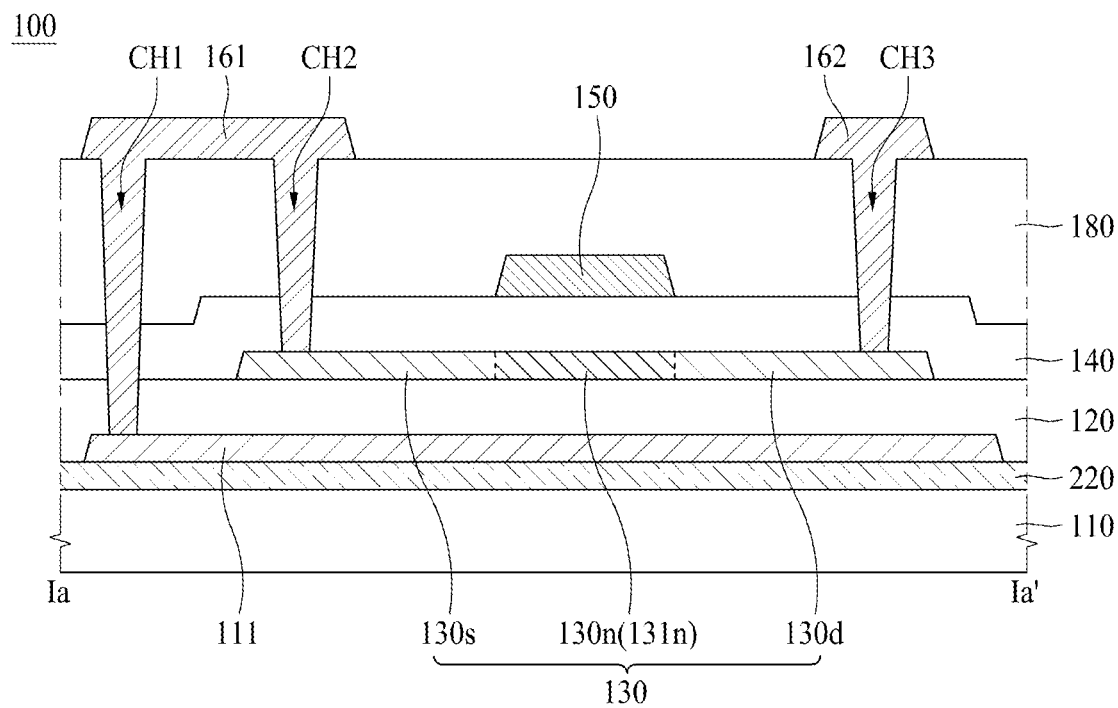
FIGS. 1B and 1C are cross-sectional views illustrating a thin film transistor according to an embodiment of the present disclosure.
Figure 1C:
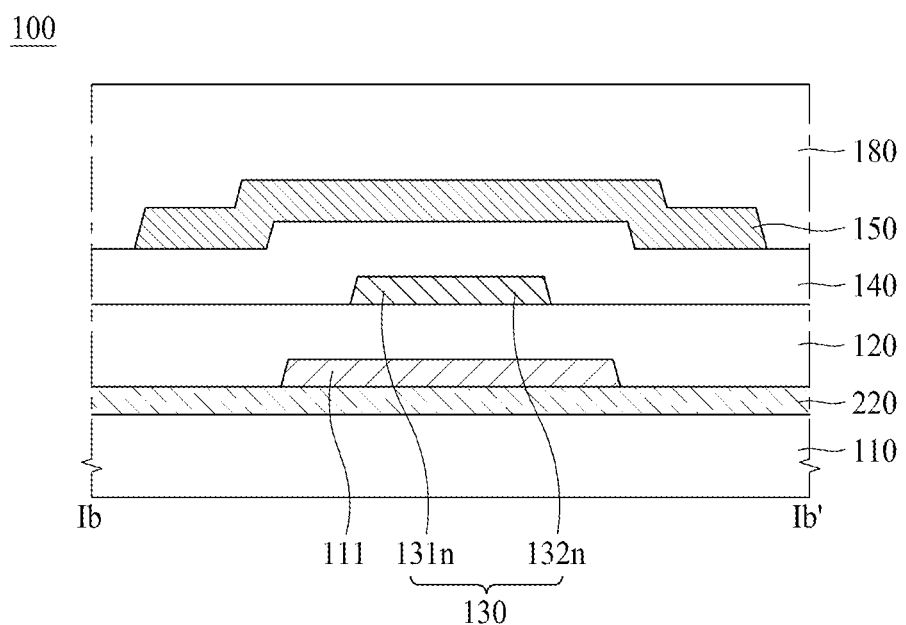

FIG. 1A is a plan view illustrating a thin film transistor 100 according to one embodiment of the present disclosure, and FIGS. 1B and 1C are cross-sectional views illustrating a thin film transistor 100 according to one embodiment of the present disclosure.

The thin film transistor 100 according to one embodiment of the present disclosure includes an active layer 130 and a gate electrode 150 at least partially overlapped with the active layer 130. The active layer 130 includes a channel portion 130n, a first connection portion 130s that is in contact with one side of the channel portion 130n, and a second connection portion 130d that is in contact with the other side of the channel portion 130n.

According to one embodiment of the present disclosure, the channel portion 130n includes a first channel area 131n and a second channel area 132n, and each of the first channel area 131n and the second channel area 132n is connected from the first connection portion 130s to the second connection portion 130d. According to one embodiment of the present disclosure, a length L1 of the first channel area 131n is shorter than a length L2 of the second channel area 132n (L1<L2). According to one embodiment of the present disclosure, the first channel area 131n and the second channel area 132n may be disposed side by side. The first channel area 131n and the second channel area 132n may be in contact with each other, or may be spaced apart from each other.

Hereinafter, the thin film transistor 100 according to one embodiment of the present disclosure will be described in more detail with reference to FIGS. 1A to 1C.

FIG. 1A is a plan view of a thin film transistor 100 according to one embodiment of the present disclosure, FIG. 1B is a cross-sectional view taken along line Ia-Ia' of FIG. 1A, and FIG. 1C is a cross-sectional view taken along line Ib-Ib' of FIG. 1A.

Referring to FIGS. 1A to 1C, the thin film transistor 100 is disposed on a substrate 110.

There is no special limitation in a type of the substrate 110. A support for supporting the thin film transistor 100 may be referred to as the substrate 110 without limitation. The substrate 110 may be, for example, glass or plastic. A transparent plastic, e.g., polyimide, which has a flexible property, may be used as the plastic. When polyimide is used as the substrate 110, a heat-resistant polyimide capable of enduring a high temperature may be used considering that a high temperature deposition process is performed on the substrate 110.

A lower buffer layer 220 may be disposed on the substrate 110. The lower buffer layer 220 may planarize an upper portion of the substrate 110, have air and moisture barrier properties and protect the thin film transistor 100 due to its insulation properties. The lower buffer layer 220 may be omitted.

A light shielding layer 111 is disposed on the lower buffer layer 220. The light shielding layer 111 has light shielding characteristics. The light shielding layer 111 may shield light incident from the outside to protect the channel portion 130n. The light shielding layer 111 may also have electrical conductivity.

The light shielding layer 111 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), titanium (Ti), or iron (Fe). The light shielding layer 111 may have a multi-layered structure that includes at least two conductive layers having their respective physical properties different from each other.

A buffer layer 120 is disposed on the light shielding layer 111. The buffer layer 120 may include at least one of an insulating material that includes at least one selected from a silicon oxide, a silicon nitride or a metal-based oxide. According to one embodiment of the present disclosure, the buffer layer 120 may include at least one of a silicon oxide or a silicon nitride. The buffer layer 120 may have a single layered structure, or may have a multi-layered structure.

The buffer layer 120 protects the active layer 130 by shielding the air and moisture. In addition, the buffer layer 120 allows the light shielding layer 111 and the channel portion 130n to be spaced apart and insulated from each other.

The active layer 130 is disposed on the buffer layer 120.

The active layer 130 may be formed of a semiconductor material. The active layer 130 may include any one of an amorphous silicon semiconductor material, a polycrystalline silicon semiconductor material and an oxide semiconductor.

According to one embodiment of the present disclosure, the active layer 130 may include an oxide semiconductor material. The oxide semiconductor material may include, for example, at least one of an IZO(InZnO)-based, an IGO (InGaO)-based, an ITO(InSnO)-based, an IGZO(InGaZnO)-based, an IGZTO(InGaZnSnO)-based, a GZTO(GaZnSnO)-based, a GZO(GaZnO)-based, an ITZO(InSnZnO)-based or a FIZO(FeInZnO)-based oxide semiconductor material, but one embodiment of the present disclosure is not limited thereto. The active layer 130 may be made of another oxide semiconductor material known in the art.

The active layer 130 includes a channel portion 130n, a first connection portion 130s, and a second connection portion 130d. One side of the channel portion 130n is in contact with the first connection portion 130s, and the other side of the channel portion 130n is in contact with the second connection portion 130d. The channel portion 130n overlaps the gate electrode 150, and serves as a channel of the thin film transistor 100. The terms overlap, overlaps, overlapping and the like are used herein in the broadest sense to include partially overlapping, at least partially overlapping, fully overlapping and other variations within the broad meaning of this term.

The first connection portion 130s and the second connection portion 130d of the active layer 130 do not overlap the gate electrode 150. The first connection portion 130s and the second connection portion 130d may be formed by selective conductorization of the semiconductor material. Providing conductivity to a selected part of active layer 130 is referred to as a selective conductorization. Selective conductorization can be performed by doping, plasma treatment, or the like.

According to one embodiment of the present disclosure, the first connection portion 130s of the active layer 130 may be a source area, and the second connection portion 130d may be a drain area. According to one embodiment of the present disclosure, the first connection portion 130s may be referred to as a source electrode, and the second connection portion 130d may be referred to as a drain electrode.

However, one embodiment of the present disclosure is not limited to the above example, and the first connection portion 130s may be a drain area, and the second connection portion 130d may be a source area. Also, the first connection portion 130s may be a drain electrode, and the second connection portion 130d may be a source electrode.

According to one embodiment of the present disclosure, the channel portion 130n includes a first channel area 131n and a second channel area 132n. The first channel area 131n may be disposed in parallel with the second channel area 132n. Referring to FIGS. 1A and 1B, the first channel area 131n and the second channel area 132n are extended from the first connection portion 130s to the second connection portion 130d, respectively.

According to one embodiment of the present disclosure, the length L1 of the first channel area 131n is smaller than the length L2 of the second channel area 132n. For example, length L1 may be approximately 5 micro meters and length L2 may be approximately 8 micro meters. The minimum length L1 is approximately 1.5 micro meters and the maximum length L2 is approximately 12 micro meters. This applies throughout this specification.

Since the length L1 of the first channel area 131n is small, a current may flow smoothly through the first channel area 131n when the thin film transistor 100 is in an ON-state. The first channel area 131n may increase an ON-current of the thin film transistor 100, thereby improving on-current characteristics of the thin film transistor 100.

Since the length L2 of the second channel area 132n is relatively large, the current flowing through the thin film transistor 100 before the thin film transistor is completely turned on may be prevented from being rapidly increased. As a result, an s-factor may be increased by the second channel area 132n.

A gate insulating layer 140 is disposed on the active layer 130. The gate insulating layer 140 may include at least one of a silicon oxide, a silicon nitride or a metal-based oxide. The gate insulating layer 140 may have a single layered structure, or may have a multi-layered structure.

Referring to FIGS. 1B and 1C, the gate insulating layer 140 may be integrally formed on an entire surface of the substrate 110. In detail, the gate insulating layer 140 may cover the channel portion 130n, the first connection portion 130s and the second connection portion 130d of the active layer 130.

However, one embodiment of the present disclosure is not limited to the above example, and the gate insulating layer 140 may be patterned. For example, the gate insulating layer 140 may be patterned in a shape corresponding to the gate electrode 150.

The gate electrode 150 is disposed on the gate insulating layer 140. The gate electrode 150 at least partially overlaps the active layer 130. The gate electrode 150 may overlap the channel portion 130n of the active layer 130.

The gate electrode 150 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a width molybdenum alloy, chromium (Cr), tantalum (Ta), neodymium (Nd), or titanium (Ti). The gate electrode 150 may have a multi-layered structure that includes at least two conductive layers having their respective physical properties different from each other.

According to one embodiment of the present disclosure, a width and a shape of the gate electrode 150 may be adjusted to adjust the lengths of the first channel area 131n and the second channel area 132n. For example, referring to FIG. 1A, a width w1 of the gate electrode 150 overlapped with the first channel area 131n may be smaller than a width w2 of the gate electrode overlapped with the second channel area 132n (w1<w2). As a result, the first channel area 131n may be made to have a length (L1<L2) smaller than that of the second channel area 132n.

According to one embodiment of the present disclosure, one gate electrode 150 may overlap the first channel area 131n and the second channel area 132n. In detail, as shown in FIG. 1A, the gate electrode 150 overlapped with the first channel area 131n and the gate electrode 150 overlapped with the second channel area 132n may be integrally formed.

Referring to FIG. 1A, the gate electrode 150 may have widths w1 and w2 that vary in a stepwise manner. In detail, the gate electrode 150 may have widths w1 and w2 that vary in a stepwise manner at a boundary of the first channel area 131n and the second channel area 132n. As a result, the first channel area 131n and the second channel area 132n, which have their respective channel lengths different from each other, may be formed by one gate electrode 150.

Also, in FIG. 1A, a portion in which the width w1 and w2 of the gate electrode 150 vary in a stepwise manner may be the boundary between the first channel area 131n and the second channel area 132n.

An interlayer insulating layer 180 is disposed on the gate electrode 150. The interlayer insulating layer 180 is an insulating layer made of an insulating material. The interlayer insulating layer 180 may be made of an organic material, may be made of an inorganic material, or may be made of a stacked body of an organic layer and an inorganic layer.

A source electrode 161 and a drain electrode 162 are disposed on the interlayer insulating layer 180.

The source electrode 161 may be connected to the light shielding layer 111 through a contact hole CH1. The source electrode 161 is connected to the active layer 130 through a contact hole CH2. The source electrode 161 may be electrically connected to the first connection portion 130s of the active layer 130 through the contact hole CH2. As a result, the light shielding layer 111 may be connected to the first connection portion 130s of the active layer 130. Since the light shielding layer 111 is connected to the source electrode 161, the light shielding layer 111 is not floating, and the same voltage as that of the source electrode 161 may be applied to the light shielding layer 111.

The drain electrode 162 is spaced apart from the source electrode 161 and connected to the active layer 130 through a contact hole CH3. In detail, the drain electrode 162 may be electrically connected to the second connection portion 130d of the active layer 130 through the contact hole CH3.

Each of the source electrode 161 and the drain electrode 162 may include at least one of molybdenum (Mo), aluminum (Al), chromium (Cr), gold (Au), titanium (Ti), nickel (Ni), neodymium (Nd), copper (Cu) or their alloy. Each of the source electrode 161 and the drain electrode 162 may be made of a single layer made of a metal or a metal alloy, or may be made of a multi-layer of two or more layers.

Referring to FIGS. 1A and 1B, the first connection portion 130s and the source electrode 161 are shown as being distinguished from each other, one embodiment of the present disclosure is not limited thereto. The first connection portion 130s may be a source electrode, and an electrode represented by a reference numeral "161" may be a connection electrode or a bridge.

In FIGS. 1A and 1B, the second connection portion 130d and the drain electrode 162 are shown as being distinguished from each other, but one embodiment of the present disclosure is not limited thereto. The second connection portion 130d may be a drain electrode, and an electrode represented by a reference numeral "162" may be a connection electrode or a bridge.

Hereinafter, the s-factor will be described.

In a drain-source current graph for a gate voltage of the thin film transistor 100, the s-factor (sub-threshold swing) is obtained by an inverse value of a slope of the graph for a threshold voltage Vth. For example, for the threshold voltage Vth of the thin film transistor 100, the s-factor may be used as an index indicating a rate of change of the drain-source current with respect to the gate voltage.

When the s-factor becomes large, a rate of change of a drain-source current $I_{DS}$ with respect to the gate voltage becomes slow.

Figure 9:
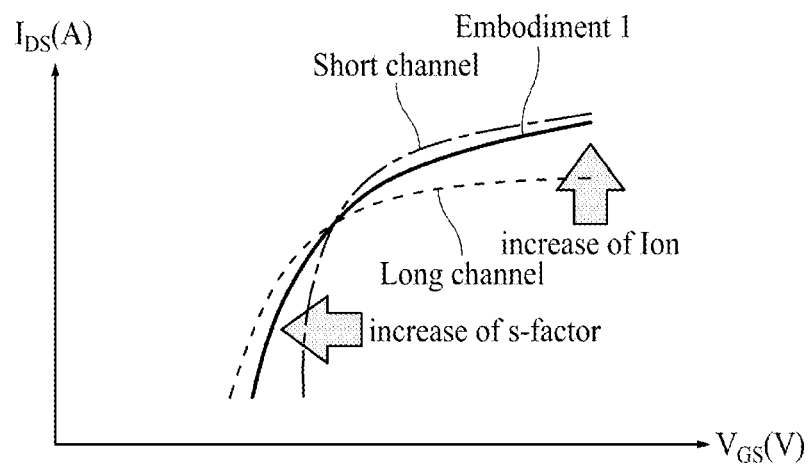
FIG. 9 is a graph illustrating threshold voltages of thin film transistors.

The s-factor may be described by a current-change graph shown in FIG. 9, for example. FIG. 9 is a threshold voltage graph for the thin film transistors. In detail, FIG. 9 illustrates the drain-source current $I_{DS}$ for the gate voltage $V_{GS}$.

For the threshold voltage Vth of the graph shown in FIG. 9, an inverse gradient of a slope (the reciprocal) in the graph of the drain-source current $I_{DS}$ for the gate voltage $V_{GS}$ is the s-factor. When the s-factor is large, a rate of change of the drain-source current $I_{DS}$ for the gate voltage is slow.

When the s-factor becomes large (the left hand side of the graph of "Embodiment 1" with a "Long channel" of FIG. 9), since the rate of change of the drain-source current $I_{DS}$ with respect to the gate voltage becomes slow, it is easy to adjust a magnitude of the drain-source current $I_{DS}$ by adjusting the gate voltage $V_{GS}$.

In the display device driven by the current, for example, in an organic light emitting display device, a gray scale of a pixel may be controlled by adjusting the magnitude of the drain-source current $I_{DS}$ of the driving thin film transistor. The magnitude of the drain-source current $I_{DS}$ of the driving thin film transistor is determined by the gate voltage. Therefore, in the organic light emitting display device driven by the current, it is easy to adjust a gray scale of a pixel as the s-factor of the driving thin film transistor TR becomes large.

Referring to FIG. 1A, the length L2 of the second channel area 132n of the channel portion 130n is relatively large. Therefore, the current flowing through the thin film transistor 100 is prevented from being rapidly increased, whereby the s-factor of the thin film transistor 100 is increased.

In the related art, in order to increase the s-factor of the thin film transistor, a method of increasing a distance between the gate electrode and the channel portion is applied. In this case, a problem occurs in that the s-factor is increased but the ON-current of the thin film transistor is reduced.

However, according to one embodiment of the present disclosure, since the s-factor of the thin film transistor 100 may be increased by the second channel area 132n, it is not necessary to increase the distance between the gate electrode 150 and the channel portion 130n.

According to one embodiment of the present disclosure, since the interval between the channel portion 130n and the gate electrode 150 is not increased, the ON-current of the thin film transistor 100 is not reduced in a state that the thin film transistor 100 is turned on. Also, since the length L1 of the first channel area 131n is small, the current may flow smoothly through the first channel area 131n when the thin film transistor 100 is in an ON-state. In detail, in the ON-state of the thin film transistor 100, the first channel area 131n of the channel portion 130n becomes a main current area, whereby the ON-current of the thin film transistor 100 may be improved.

Therefore, the thin film transistor 100 according to one embodiment of the present disclosure may have excellent s-factor characteristics and ON-current characteristics. Since the thin film transistor 100 according to one embodiment of the present disclosure has a large s-factor, the thin film transistor 100 may be used as a driving transistor of a display device.

Figure 2A:
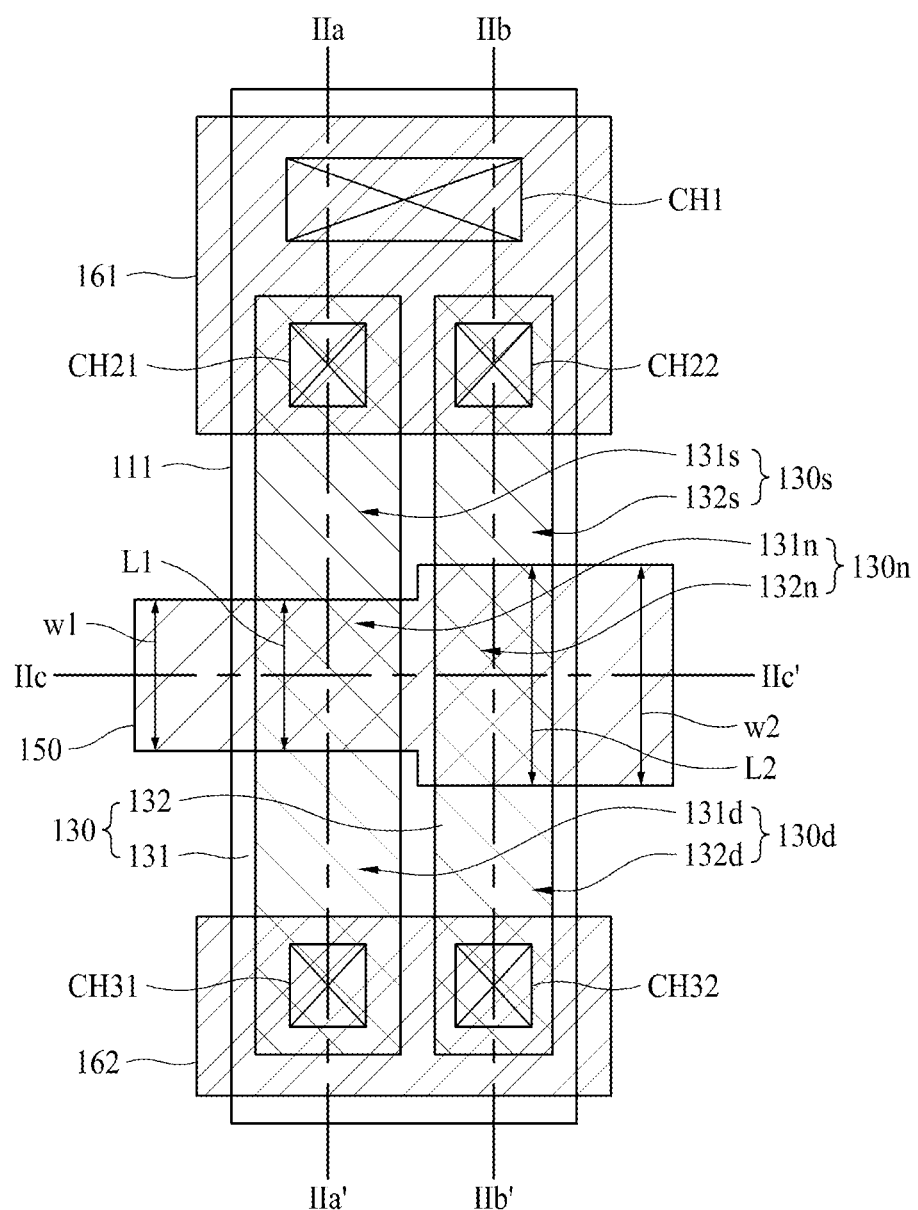
FIG. 2A is a plan view illustrating a thin film transistor according to an embodiment of the present disclosure.
Figure 2B:
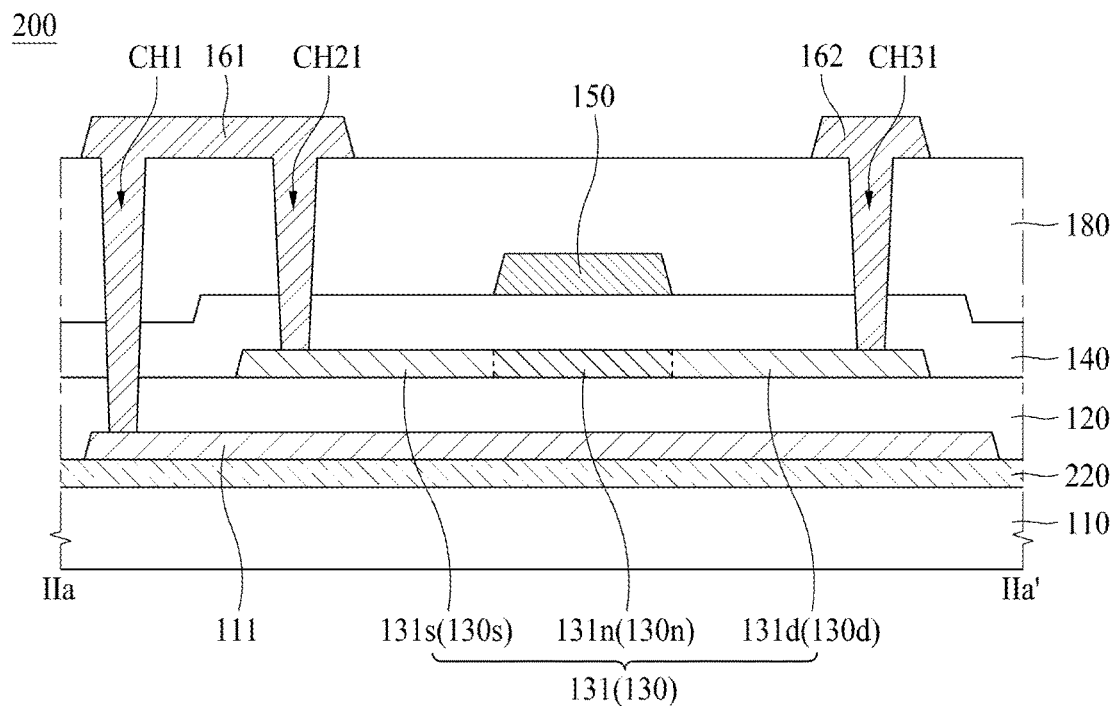
FIGS. 2B, 2C and 2D are cross-sectional views illustrating a thin film transistor according to an embodiment of the present disclosure.
Figure 2C:
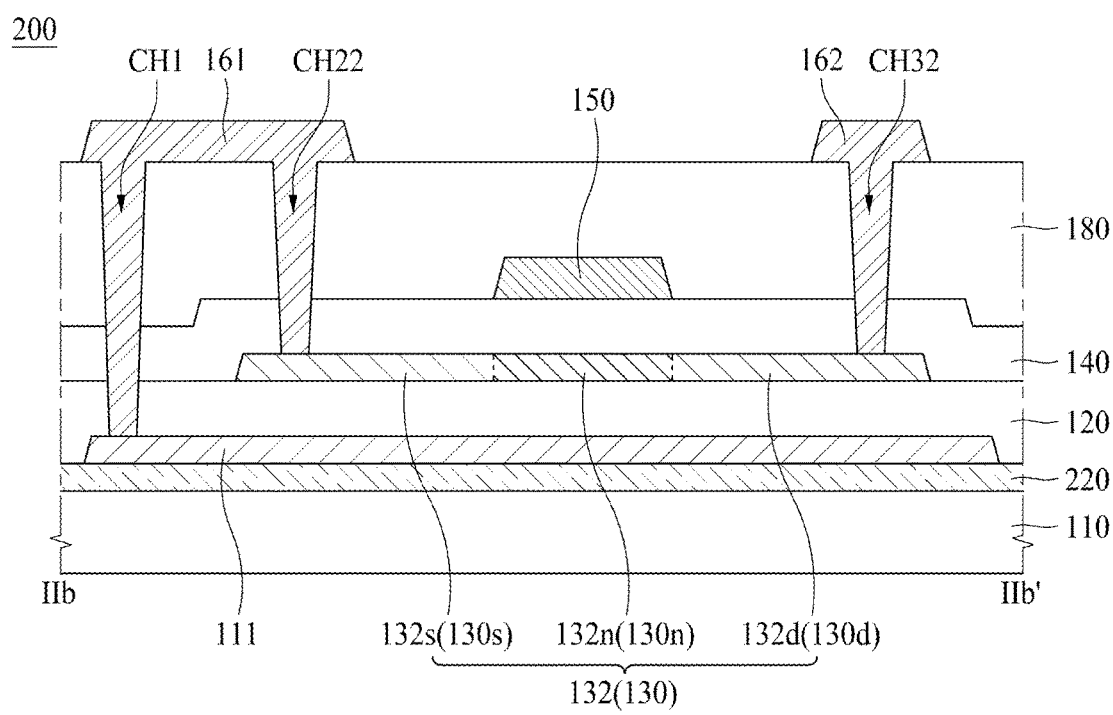
Figure 2D:
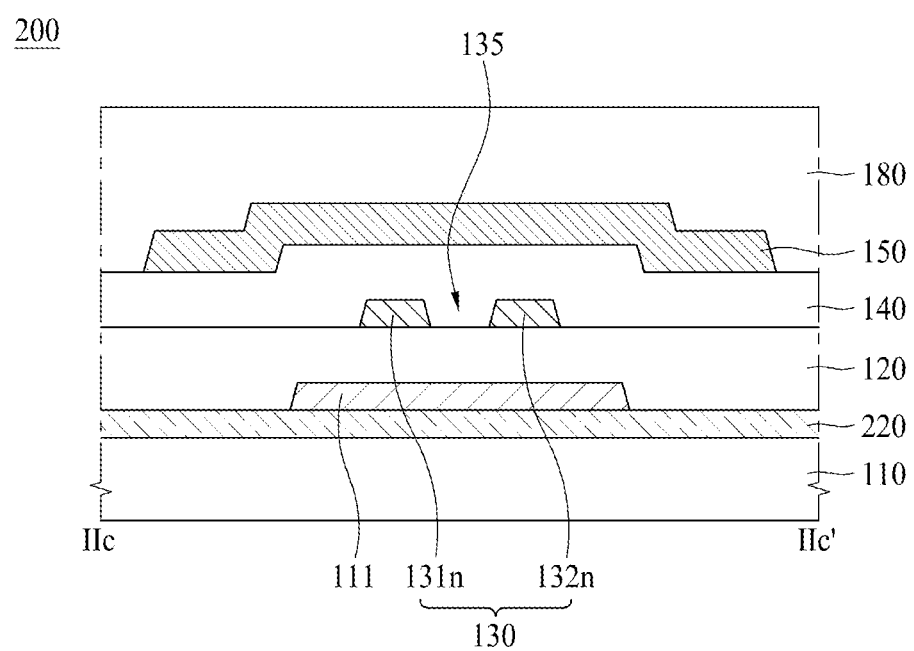

FIG. 2A is a plan view illustrating a thin film transistor according to another embodiment of the present disclosure, and FIGS. 2B, 2C and 2D are cross-sectional views illustrating a thin film transistor according to another embodiment of the present disclosure. In detail, FIG. 2B is a cross-sectional view taken along line IIa-IIa' of FIG. 2A, FIG. 2C is a cross-sectional view taken along line IIb-IIb' of FIG. 2A, and FIG. 2D is a cross-sectional view taken along line IIc-IIc' of FIG. 2A.

In the thin film transistor 200 of FIG. 2A in comparison with the thin film transistor 100 of FIG. 1A, the active layer 130 is divided into a first active layer 131 and a second active layer 132. Hereinafter, the description of the elements already described will be omitted in order to avoid redundancy.

Referring to FIG. 2A, in the thin film transistor 200 according to another embodiment of the present disclosure, the active layer 130 includes a first active layer 131 and a second active layer 132. The first active layer 131 and the second active layer 132 are disposed on the same layer, and are spaced apart from each other. The first active layer 131 and the second active layer 132 are spaced apart from each other on a plane. This has the benefit that during the manufacturing process, the first channel and the second channel line up with the first active layer and second active layer respectively. This has the operational benefit of providing the desirable s-factor and Ion performance.

Referring to FIGS. 2A and 2B, the first active layer 131 includes a first channel area 131n, and the second active layer 132 includes a second channel area 132n.

The first active layer 131 includes a first channel area 131n, a first connection portion 131s and a second connection portion 131d. The first channel area 131n becomes a channel portion of the first active layer 131.

Referring to FIGS. 2A and 2C, the second active layer 132 includes a second channel area 132n, a first connection portion 132s and a second connection portion 132d. The second channel area 132n becomes a channel portion of the second active layer 132.

The first connection portion 131s of the first active layer 131 and the first connection portion 132s of the second active layer 132 constitute the first connection portions 131s and 132s of the active layer 130. The first connection portion 131s of the first active layer 131 and the first connection portion 132s of the second active layer 132 may be connected to the source electrode 161 through contact holes CH21 and CH22, respectively.

The second connection portion 131d of the first active layer 131 and the second connection portion 132d of the second active layer 132 constitute the second connection portions 131d and 132d of the active layer 130. The second connection portion 131d of the first active layer 131 and the second connection portion 132d of the second active layer 132 may be connected to the drain electrode 162 through contact holes CH31 and CH32, respectively.

Referring to FIGS. 2A and 2D, the first active layer 131 and the second active layer 132 are spaced apart from each other in an area overlapped with the gate electrode 150. As a result, the first channel area 131*n* and the second channel area 132*n* are spaced apart from each other.

The gate electrode 150 has widths w1 and w2 that vary in a stepwise manner between the first channel area 131*n* and the second channel area 132*n*. Therefore, as shown in FIG. 2A, the length L1 of the first channel area 131*n* is shorter than the length L2 of the second channel area 132*n* (L1<L2).

Since the length L1 of the first channel area 131*n* is small, the current may flow smoothly through the first channel area 131*n* in the ON-state of the thin film transistor 200, whereby the thin film transistor 200 may have excellent ON-current characteristics. This case will be equally applied to other embodiments described herein.

In addition, since the length L2 of the second channel area 132*n* is relatively large, the current may be prevented from being rapidly increased so that the thin film transistor 200 may have a large s-factor. This case will be equally applied to other embodiments described herein.

Figure 3A:
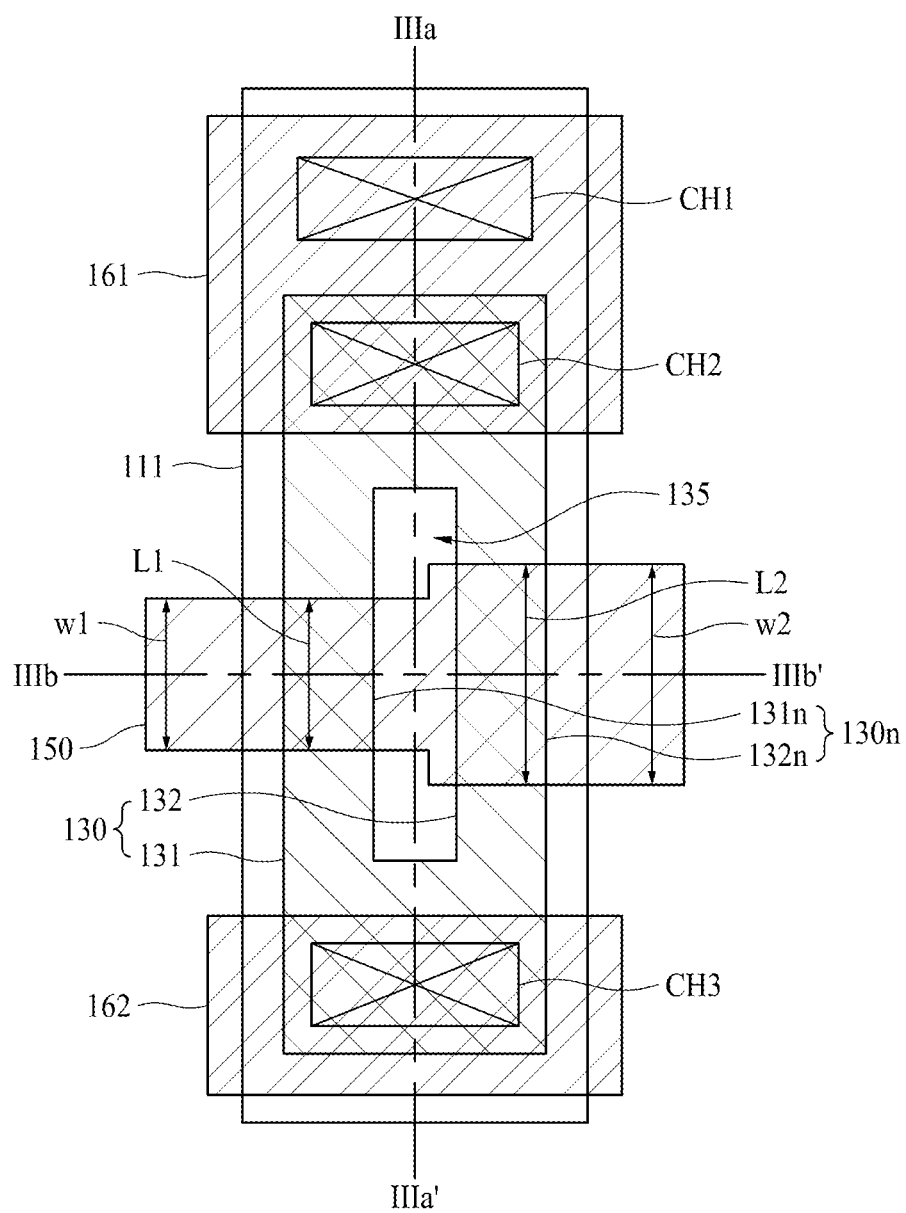
FIG. 3A is a plan view illustrating a thin film transistor according to another example of the present disclosure.
Figure 3B:
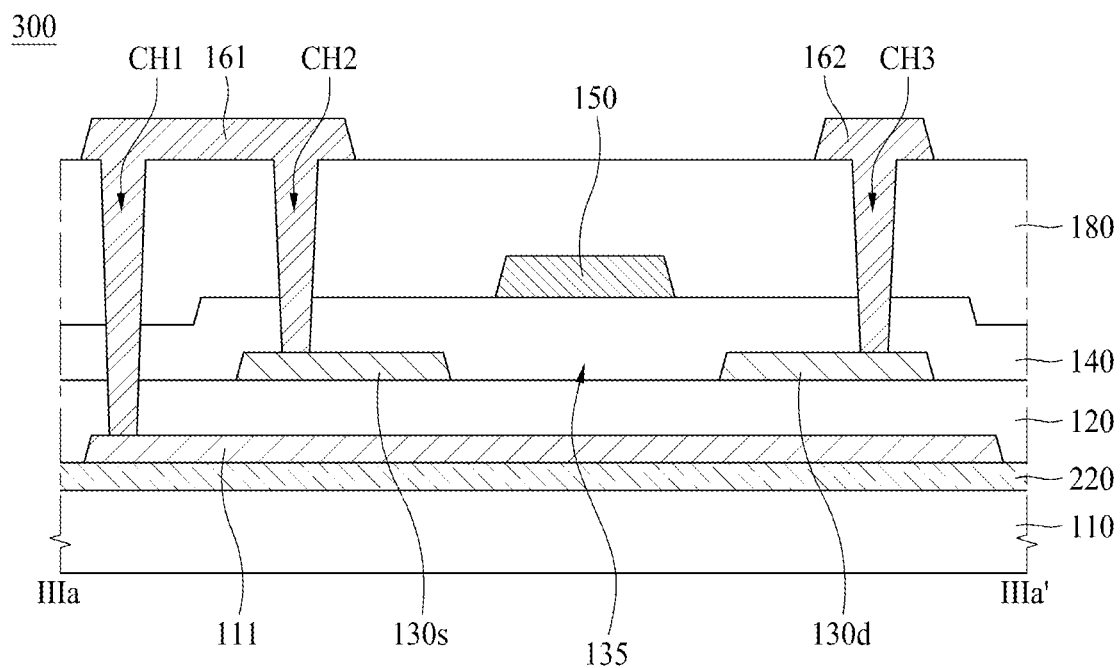
FIGS. 3B and 3C are cross-sectional views illustrating a thin film transistor according to an embodiment of the present disclosure.
Figure 3C:
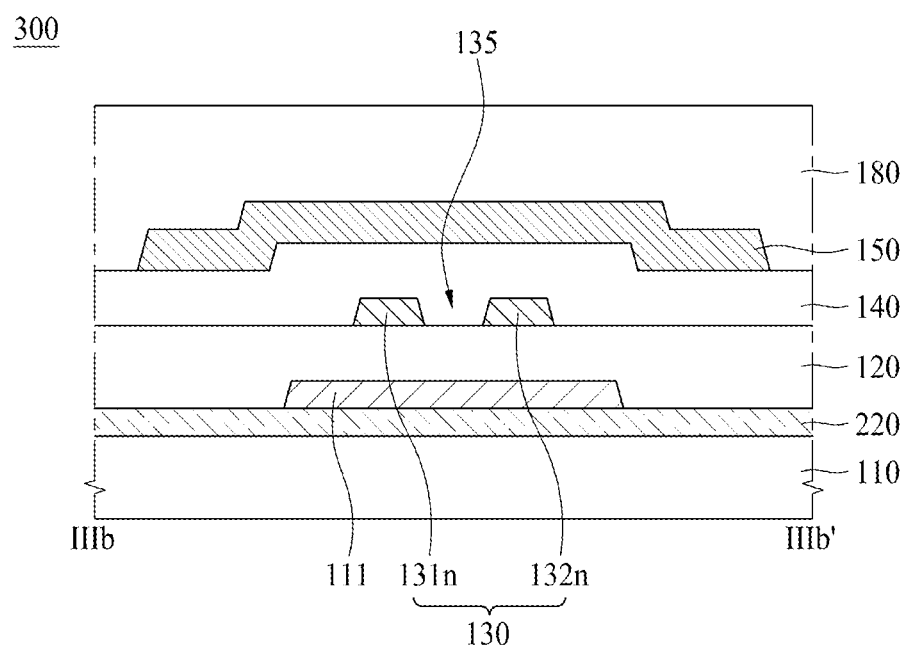

FIG. 3A is a plan view illustrating a thin film transistor according to still another embodiment of the present disclosure, and FIGS. 3B and 3C are cross-sectional views illustrating a thin film transistor according to still another embodiment of the present disclosure. In detail, FIG. 3B is a cross-sectional view taken along line IIIa-IIIa' of FIG. 3A, and FIG. 3C is a cross-sectional view taken along line of FIG. 3A.

Referring to FIGS. 3A to 3C, a vacant area 135 surrounded by the active layer 130 is positioned in the same layer as the active layer 130. According to one embodiment of the present disclosure, the vacant area 135 is surrounded by the active layer 130 in the same layer as the active layer 130 and overlaps the gate electrode 150, and refers to an area in which the active layer 130 is not disposed. This has the benefit that during the manufacturing process, the first channel and the second channel line up with the first active layer and second active layer respectively. This has the operational benefit of providing the desirable s-factor and Ion performance.

Referring to FIG. 3A, the active layer 130 may be disposed to overlap the gate electrode 150 and to surround the vacant area in a plan view. The active layer 130 is not disposed in the vacant area 135.

Referring to FIG. 3A, since the vacant area 135 is positioned in the area overlapped with the gate electrode 150, the first channel area 131*n* and the second channel area 132*n* are spaced apart from each other. The active layer 130 may be integrally formed outside the vacant area 135.

The first connection portion 130*s* is in contact with the first channel area 131*n* and the second channel area 132*n*, respectively, and may be integrally formed outside the vacant area 135 to constitute one first connection portion 130*s*. The second connection portion 130*d* may be in contact with the first channel area 131*n* and the second channel area 132*n*, respectively, and may be integrally formed outside the vacant area 135 to constitute one second connection portion 130*d*.

The gate electrode 150 has widths w1 and w2 that vary in a stepwise manner between the first channel area 131*n* and the second channel area 132*n*. The first channel area 131*n* and the second channel area 132*n* may have their respective lengths (L1<L2) different from each other.

Figure 4:
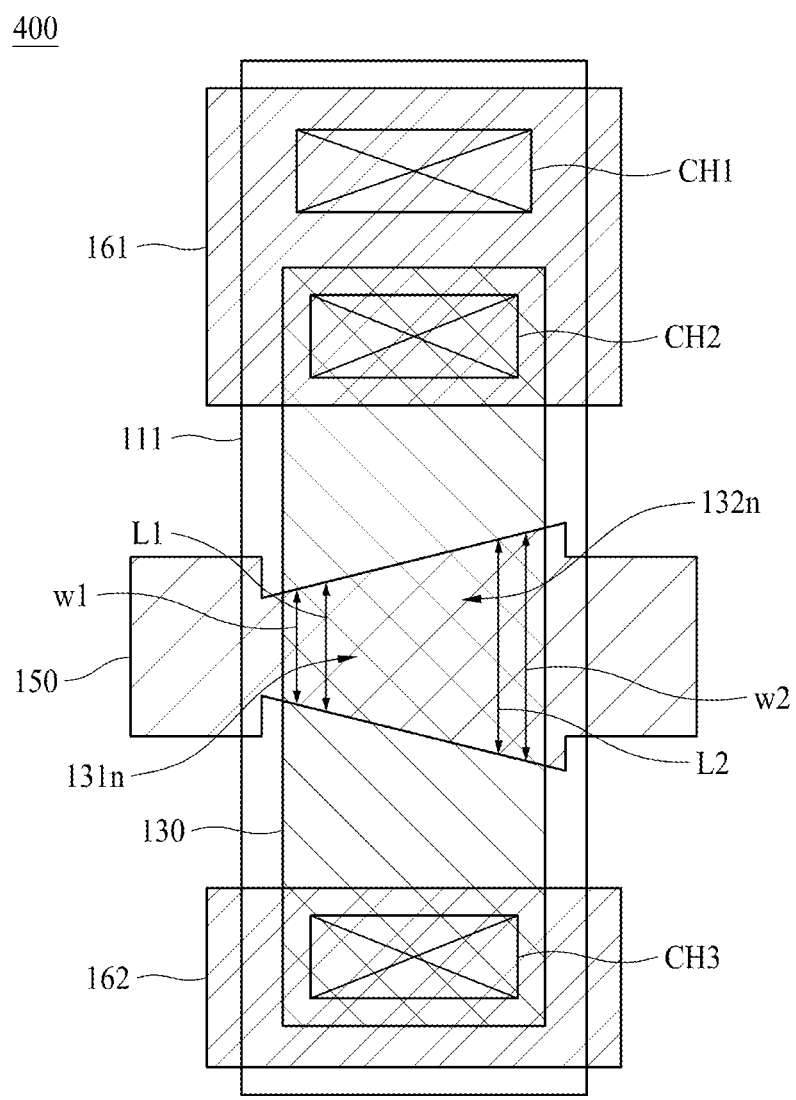
FIG. 4 is a plan view illustrating a thin film transistor according to another example of the present disclosure.

FIG. 4 is a plan view illustrating a thin film transistor 400 according to further still another embodiment of the present disclosure.

Referring to FIG. 4, the gate electrode 150 has a width that is gradually changed in the area overlapped with the active layer 130. In detail, in the area overlapped with the active layer 130, the gate electrode 150 may have a small width w1 and a great width w2.

According to one embodiment of the present disclosure, the active layer 130 overlapped with a portion of the gate electrode 150, which has a small width w1, may be referred to as the first channel area 131*n*, and the active layer 130 overlapped with a portion of the gate electrode 150, which has a great width w2, may be referred to as the second channel area 132*n*.

According to another embodiment of the present disclosure, the gate electrode 150 may have widths w1 and w2 that are gradually changed along a direction from the first channel area 131*n* to the second channel area 132*n*. Therefore, the channel portion 130*n* may have channel lengths L1 and L2 that are gradually changed along the direction from the first channel area 131*n* to the second channel area 132*n*. As a result, the first channel area 131*n* may have a length shorter than that of the second channel area 132*n* (L1<L2).

Figure 5:
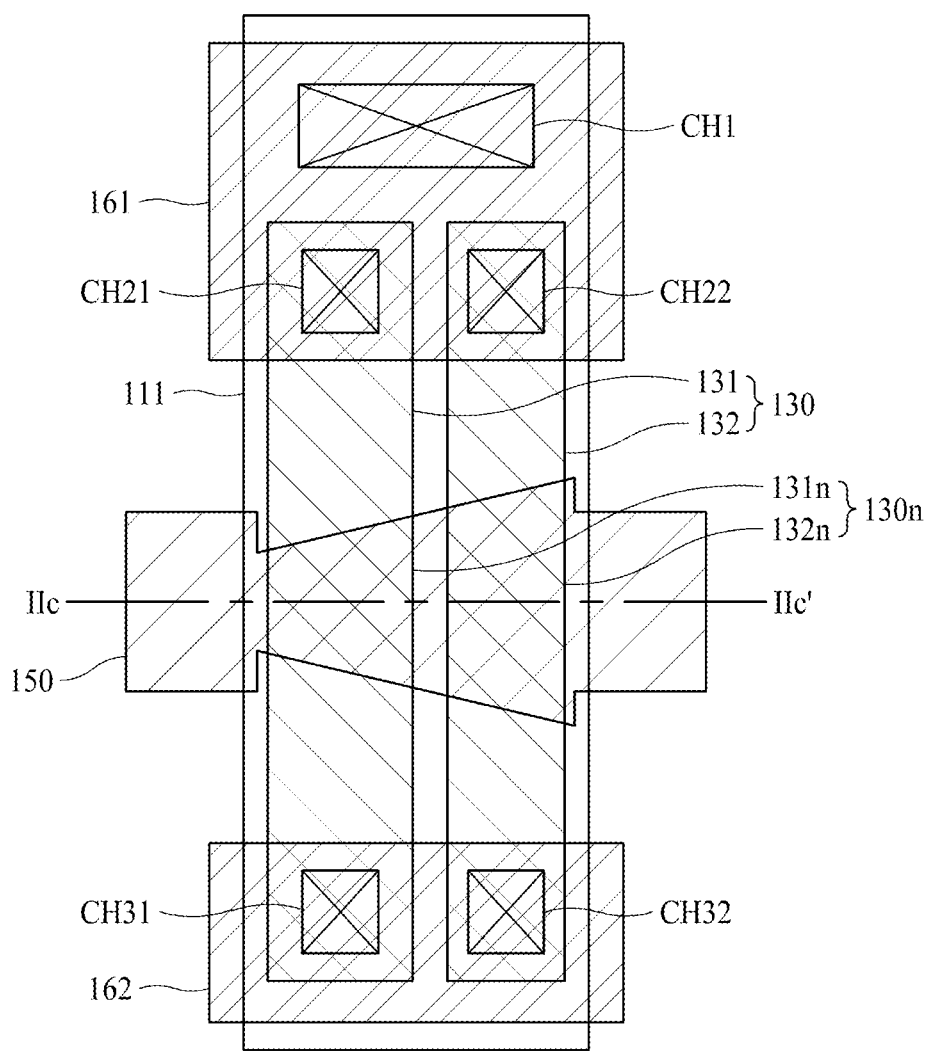
FIG. 5 is a plan view illustrating a thin film transistor according to another example of the present disclosure.

FIG. 5 is a plan view illustrating a thin film transistor 500 according to further still another embodiment of the present disclosure.

Referring to FIG. 5, the active layer 130 includes a first active layer 131 and a second active layer 132, and the first active layer 131 and the second active layer 132 are spaced apart from each other on a plane. The first active layer 131 includes a first channel area 131*n*, and the second active layer 132 includes a second channel area 132*n*.

In addition, the gate electrode 150 has widths w1 and w2 that are gradually changed in an area overlapped with the active layer 130. As shown in FIG. 5, since the gate electrode 150 has a width that is gradually increased along the direction from the first channel area 131*n* to the second channel area 132*n*, the second channel area 132*n* may have a channel length greater than that of the first channel area 131*n*.

Figure 6:
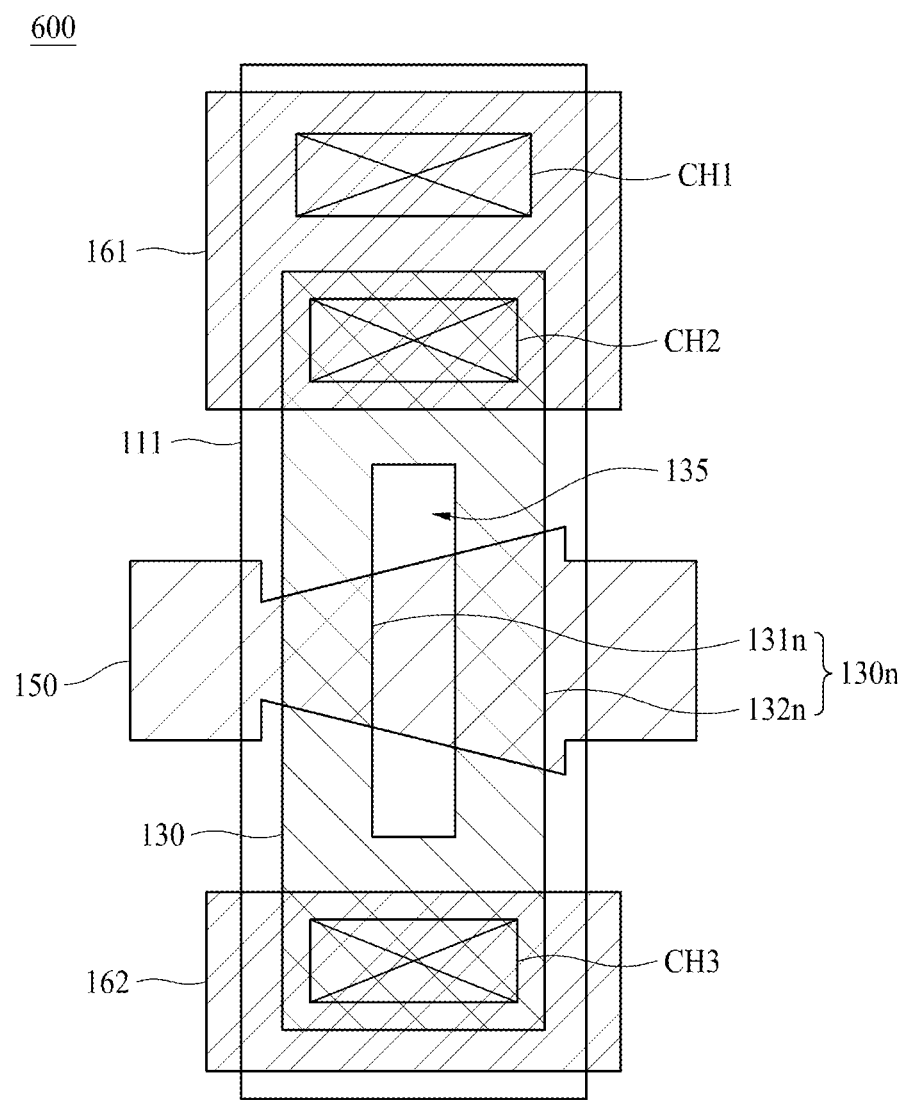
FIG. 6 is a plan view illustrating a thin film transistor according to another example of the present disclosure.

FIG. 6 is a plan view illustrating a thin film transistor 600 according to further still another embodiment of the present disclosure.

Referring to FIG. 6, a vacant area 135 surrounded by the active layer 130 is positioned in the same layer as the active layer 130. According to one embodiment of the present disclosure, the vacant area 135 is surrounded by the active layer 130 in the same layer as the active layer 130, and overlaps the gate electrode 150. The active layer 130 is not disposed in the vacant area 135.

Also, referring to FIG. 6, the gate electrode 150 has a width that is gradually varied in an area overlapped with the active layer 130. Since the gate electrode 150 has a width that is gradually increased along the direction from the first channel area 131*n* to the second channel area 132*n*, the second channel area 132*n* may have a channel length greater than that of the first channel area 131*n*.

Figure 7A:
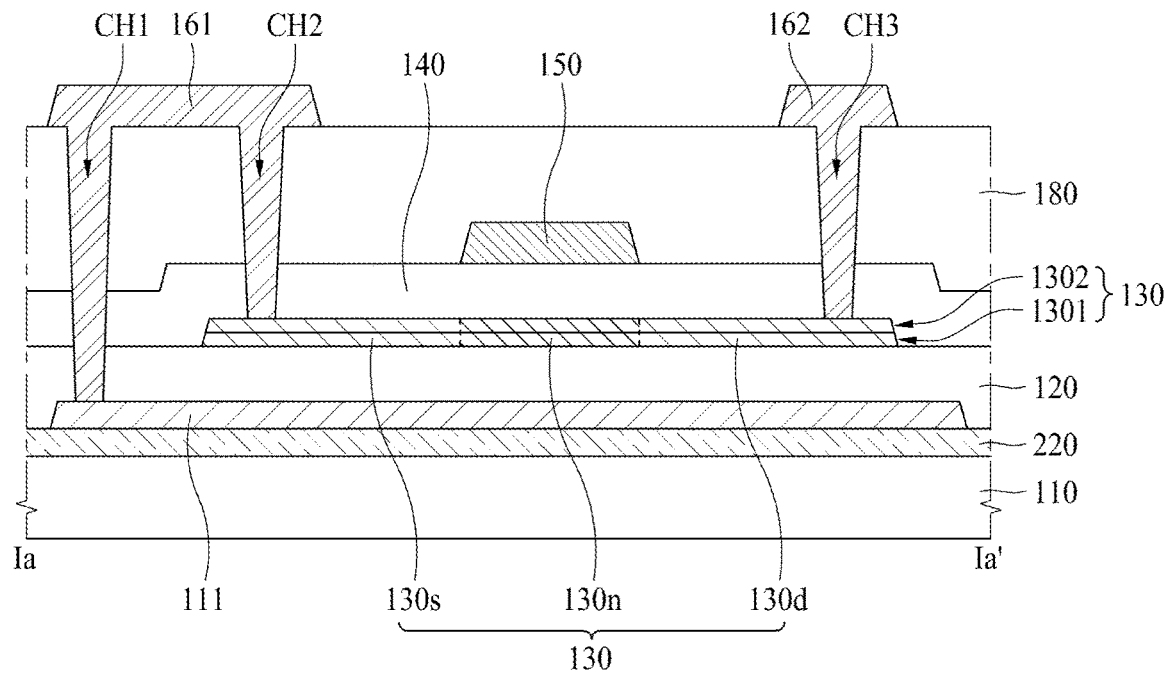
FIGS. 7A and 7B are cross-sectional views illustrating a thin film transistor according to another example of the present disclosure.
Figure 7B:
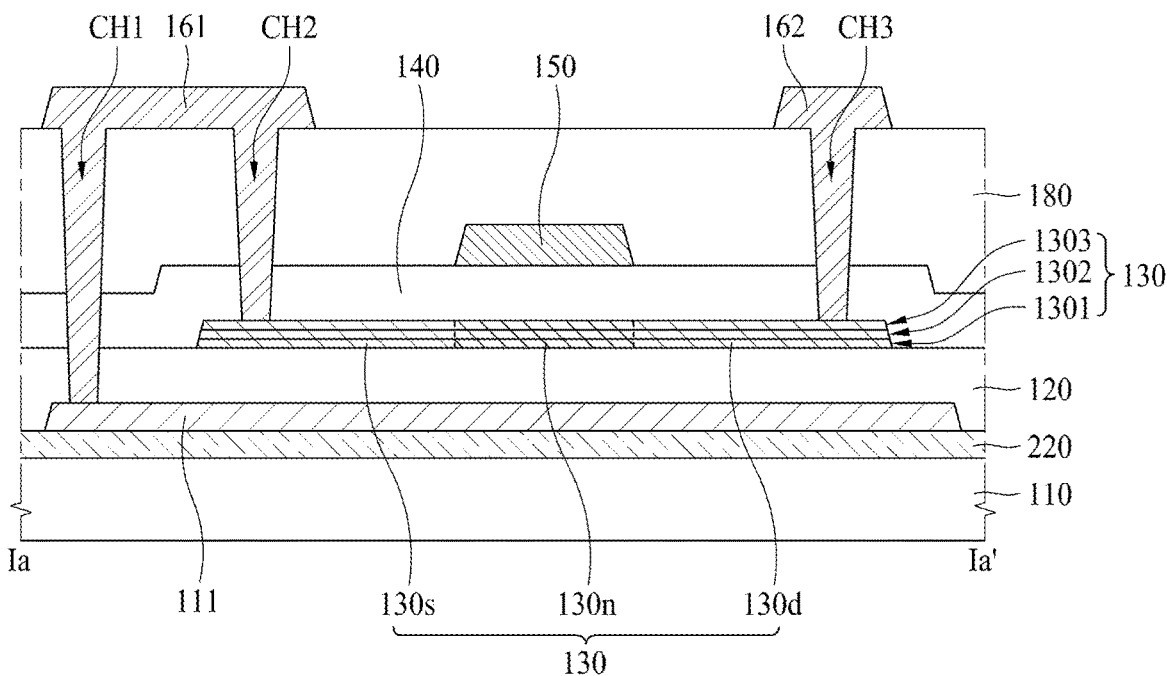

FIGS. 7A and 7B are cross-sectional views illustrating thin film transistors 701 and 702, respectively, according to another embodiment of the present disclosure. A structure of the active layer 130 shown in FIGS. 7A and 7B may be applied to the active layer 130 of the thin film transistors 100, 200, 300, 400, 500 and 600 shown in FIGS. 1A, 1B, 1C, 2A, 2B, 2C, 2D, 3A, 3B, 3C, 4, 5 and 6.

Referring to FIG. 7A, the active layer 130 of the thin film transistor 701 has a multi-layered structure. In detail, referring to FIG. 7A, the active layer 130 includes a first oxide semiconductor layer 1301 on the substrate 110 and a second oxide semiconductor layer 1302 on the first oxide semiconductor layer 1301. The first oxide semiconductor layer 1301 and the second oxide semiconductor layer 1302 may include the same semiconductor material, or may include their respective semiconductor materials different from each other.

The first oxide semiconductor layer 1301 supports the second oxide semiconductor layer 1302. Therefore, the first oxide semiconductor layer 1301 is referred to as a "support layer." The channel portion 130n may be formed in the second oxide semiconductor layer 1302. Therefore, the second oxide semiconductor layer 1302 is referred to as a "channel layer," but one embodiment of the present disclosure is not limited thereto, and the channel portion 130n may be formed in the first oxide semiconductor layer 1301.

A structure in which the active layer 130 includes a first oxide semiconductor layer 1301 and a second oxide semiconductor layer 1302 is referred to as a bi-layer structure.

In the thin film transistor 702 of FIG. 7B in comparison with the thin film transistor 701 of FIG. 7A, the active layer 130 further includes a third oxide semiconductor layer 1303 on the second oxide semiconductor layer 1302.

Referring to FIG. 7B, the active layer 130 includes a first oxide semiconductor layer 1301, a second oxide semiconductor layer 1302 and a third oxide semiconductor layer 1303, but other embodiments of the present disclosure are not limited thereto, and the active layer 130 may further include another semiconductor layer. With three oxide semiconductor layers, the middle layer 1302 is protected from damage during manufacture in both directions, for example the bottom oxide semiconductor layer protects the middle semiconductor layer from gases during manufacture, and the top oxide semiconductor layer protects the middle semiconductor layer from etchant or gases during the manufacture process.

Figure 8:
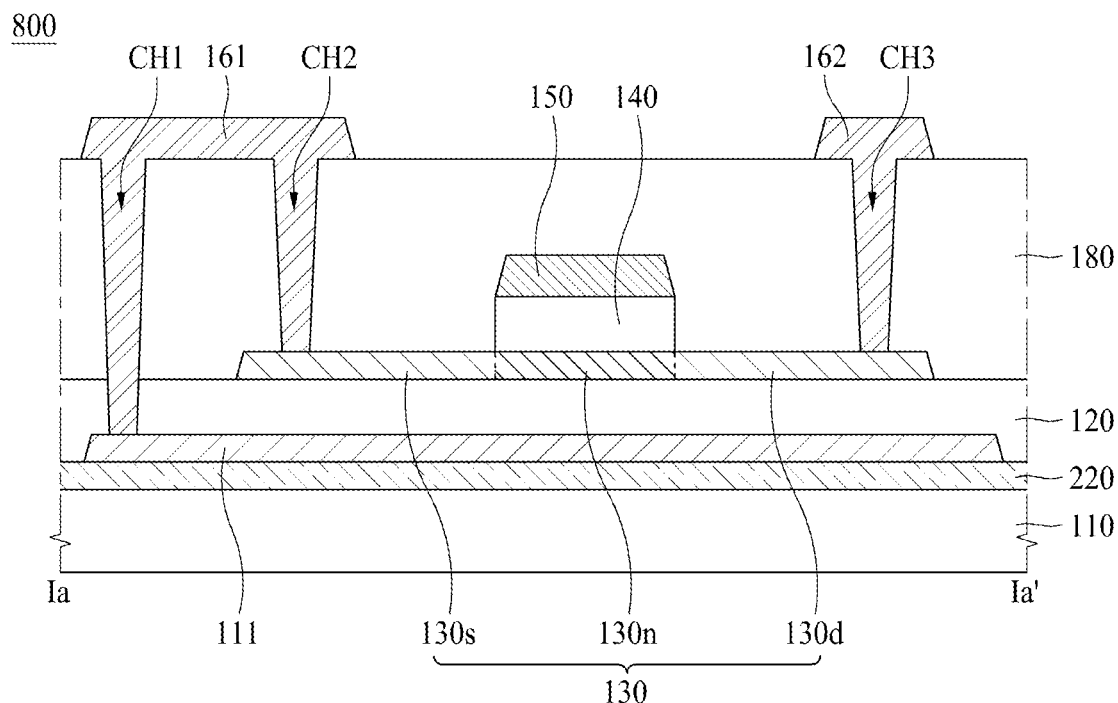
FIG. 8 is a cross-sectional view illustrating a thin film transistor according to further still another example of the present disclosure.

FIG. 8 is a cross-sectional view illustrating a thin film transistor 800 according to further still another embodiment of the present disclosure. The structure of the gate insulating layer 140 shown in FIG. 8 may be applied to the gate insulating layer 140 of the thin film transistors 100, 200, 300, 400, 500, 600, 701 and 702 shown in FIGS. 1A, 1B, 1C, 2A, 2B, 2C, 2D, 3A, 3B, 3C, 4, 5, 6, 7A and 7B.

Referring to FIG. 8, the gate insulating layer 140 may be patterned. The gate insulating layer 140 may be patterned to cover the channel portion 130n, for example. In the patterning process of the gate insulating layer 140, the active layer 130 may be selectively conductorized so that the first connection portion 130s and the second connection portion 130d may be formed.

FIG. 9 is a graph illustrating threshold voltages of thin film transistors. The threshold voltage graph for the thin film transistors is represented by the graph of the drain-source current $I_{DS}$ for the gate voltage $V_{GS}$.

In FIG. 9, "Embodiment 1" is a threshold voltage graph for a thin film transistor having the same structure as that of the thin film transistor 100 of FIG. 1.

In FIG. 9, the "Short channel" is a threshold voltage graph for a thin film transistor having only a channel portion 130n of a short length. In FIG. 9, the "Long channel" is a threshold voltage graph for a thin film transistor having only a channel portion 130n of a long length. In FIG. 9, the arrow marked "increase of s-factor" indicates the direction in which the s-factor increases. In addition, the arrow marked "increase of Ion" indicates the direction in which the magnitude of the on-current (Ion) increases.

Referring to FIG. 9, it is noted that the "Short channel" thin film transistor having a channel portion 130n of a short length has excellent ON-current characteristics, but the current flowing through the thin film transistor before the thin film transistor is completely turned on is rapidly increased so that it has a small s-factor.

On the other hand, it is noted that the "Long channel" thin film transistor having a channel portion 130n of a long length has a large s-factor but has a small ON-current value.

The thin film transistor (Embodiment 1) according to one embodiment of the present disclosure has excellent ON-current characteristics due to its first channel area 131n of a short length L1 corresponding to a "Short channel," and has excellent s-factor characteristics due to its second channel area 132n of a long length L2 corresponding to a "Long channel."

Hereinafter, the display device comprising the thin film transistors 100, 200, 300, 400, 500, 600, 701, 702 and 800 described herein will be described in detail. The display device may comprise an LED, OLED, LCD, PDP, microLED, or a miniLED display device.

Figure 10:
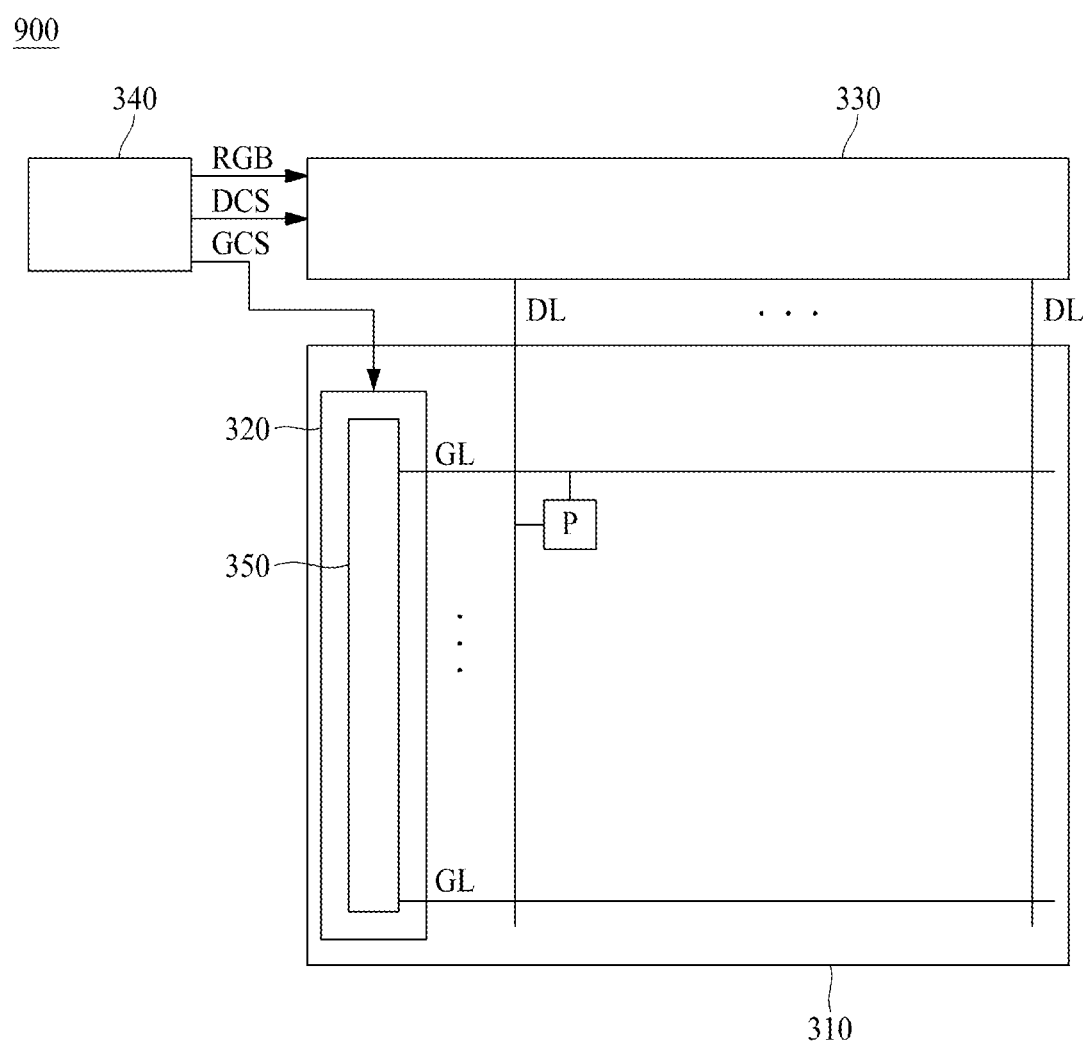
FIG. 10 is a schematic view illustrating a display device according to an embodiment of the present disclosure.

FIG. 10 is a schematic view illustrating a display device 900 according to another embodiment of the present disclosure.

As shown in FIG. 10, the display device 900 according to another embodiment of the present disclosure includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 may be packaged on the substrate 110. In this way, a structure in which the gate driver 320 is directly packaged on the substrate 110 will be referred to as a Gate In Panel (GIP) structure.

Figure 11:
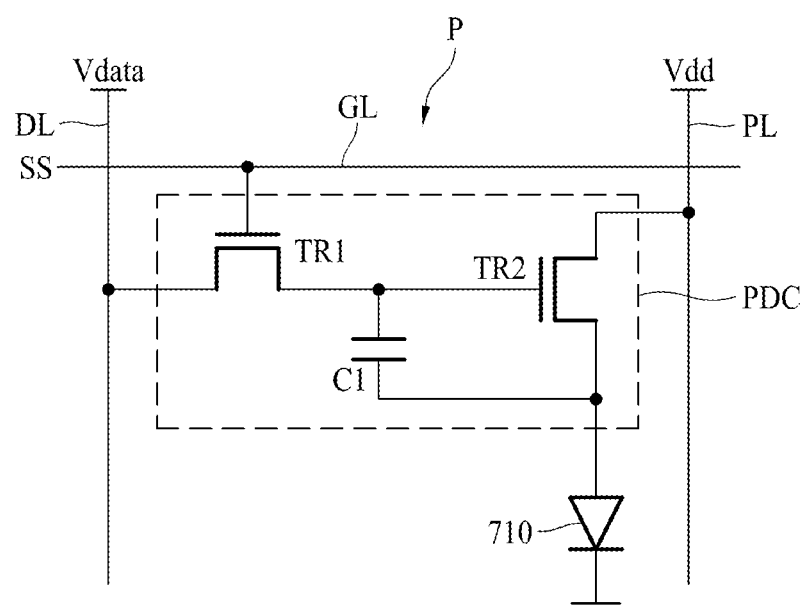
FIG. 11 is a circuit view illustrating any one pixel of FIG. 10.
Figure 12:
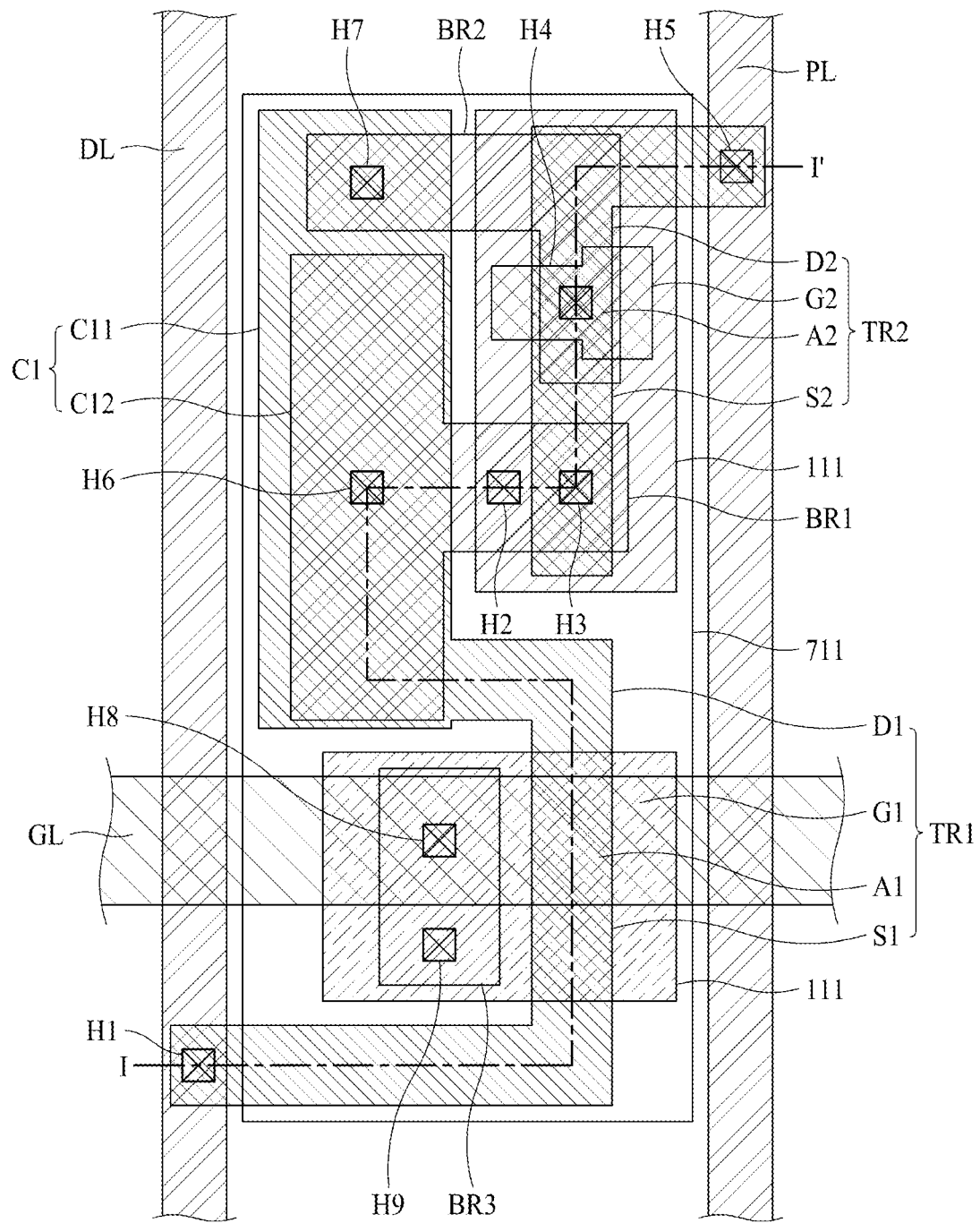
FIG. 12 is a plan view illustrating the pixel of FIG. 11.
Figure 13:
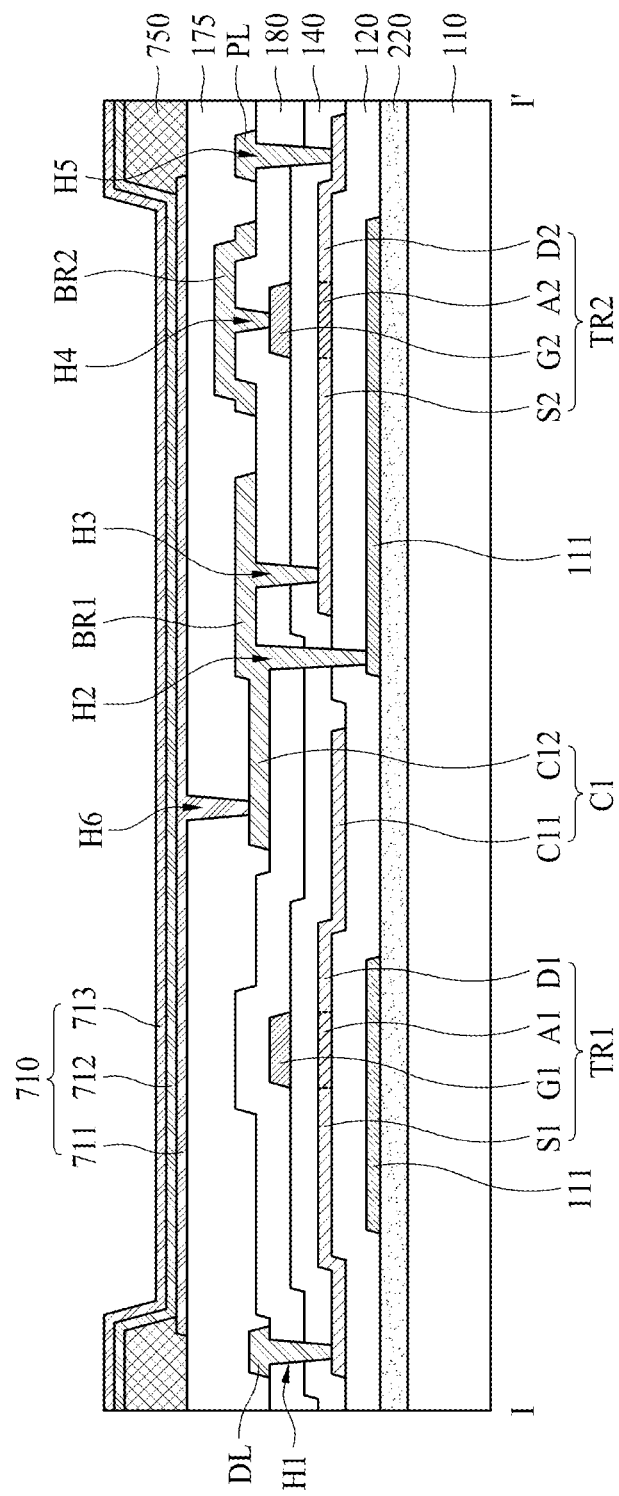
FIG. 13 is a cross-sectional view taken along line I-I' of FIG. 12.

FIG. 11 is a circuit view illustrating any one pixel P of FIG. 10, FIG. 12 is a plan view illustrating a pixel P of FIG. 11, and FIG. 13 is a cross-sectional view taken along line I-I' of FIG. 12.

The circuit view of FIG. 11 is an equivalent circuit view for the pixel P of the display device 900 that includes an organic light emitting diode (OLED) as a display element 710.

The pixel P includes a display element 710 and a pixel driving circuit PDC for driving the display element 710.

The pixel driving circuit PDC of FIG. 11 includes a first thin film transistor TR1 that is a switching transistor, and a second thin film transistor TR2 that is a driving transistor. For example, the thin film transistors 100, 200, 300, 400, 500, 600, 701, 702 and 800 described in any of the examples above may be used as the second thin film transistor TR2.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls the driving voltage Vdd. The driving voltage Vdd is a pixel driving voltage for driving the organic light emitting diode (OLED) that is the display element 710.

When the first thin film transistor TR1 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a first capacitor C1 formed between the gate electrode G2 and a source electrode S2 of the second thin film transistor TR2. The first capacitor C1 is a storage capacitor Cst.

The amount of a current supplied to the organic light emitting diode (OLED), which is the display element 710, through the second thin film transistor TR2 is controlled in accordance with the data voltage Vdata, whereby a gray scale of light emitted from the display element 710 may be controlled.

Referring to FIGS. 12 and 13, the first thin film transistor TR1 and the second thin film transistor TR2 are disposed on the substrate 110.

The substrate 110 may be made of glass or plastic. Plastic having a flexible property, for example, polyimide (PI) may be used as the substrate 110.

A lower buffer layer 220 is disposed on the substrate 110, and a light shielding layer 111 is disposed on the lower buffer layer 220.

A buffer layer 120 is disposed on the light shielding layer 111. The buffer layer 120 is made of an insulating material, and protects active layers A1 and A2 from external water or oxygen.

The active layer A1 of the first thin film transistor TR1 and the active layer A2 of the second thin film transistor TR2 are disposed on the buffer layer 120.

Each of the active layers A1 and A2 may include at least one of, for example, an amorphous silicon semiconductor material, a polycrystalline silicon semiconductor material, or an oxide semiconductor material. Each of the active layers A1 and A2 may be made of an oxide semiconductor layer made of an oxide semiconductor material.

In the first thin film transistor TR1, the active layer A1 may include a channel portion, a first connection portion, and a second connection portion. The channel portion of the active layer A1 overlaps the gate electrode G1. The first connection portion of the active layer A1 may be referred to as a first source electrode S1, and the second connection portion may be referred to as a first drain electrode D1.

In the second thin film transistor TR2, the active layer A2 may include a channel portion, a first connection portion, and a second connection portion. The channel portion of the active layer A2 overlaps the gate electrode G2. The first connection portion of the active layer A2 may be referred to as a second source electrode S2, and the second connection portion may be referred to as a second drain electrode D2.

Referring to FIGS. 12 and 13, a portion of the active layer A1 of the first thin film transistor TR1 may be conductorized to become a first capacitor electrode C11 of the first capacitor C1.

A gate insulating layer 140 is disposed on the active layers A1 and A2. The gate insulating layer 140 may cover entire upper surfaces of the active layers A1 and A2, or may cover only a portion of the active layers A1 and A2.

The gate electrode G1 of the first thin film transistor TR1 and the gate electrode G2 of the second thin film transistor TR2 are disposed on the gate insulating layer 140.

Referring to FIG. 12, the gate electrode G2 of the second thin film transistor TR2 may have a width that is changed in a stepwise manner. In detail, the gate electrode G2 may have widths w1 and w2 that are changed in a stepwise manner at a boundary between the first channel area 131$n$ and the second channel area 132$n$. As a result, the first channel area 131$n$ and the second channel area 132$n$, which have their respective channel lengths different from each other, may be formed by the gate electrode G2.

An interlayer insulating layer 180 is disposed on the gate electrodes G1 and G2.

The data line DL and the driving power line PL are disposed on the interlayer insulating layer 180.

The data line DL is in contact with the first source electrode S1 formed in the active layer A1 of the first thin film transistor TR1 through a first contact hole H1. According to another embodiment of the present disclosure, a portion of the data line DL overlapped with the active layer A1 of the first thin film transistor TR1 may be referred to as the first source electrode S1.

The driving power line PL is in contact with the second drain electrode D2 formed in the active layer A2 of the second thin film transistor TR2 through a fifth contact hole H5. According to another embodiment of the present disclosure, a portion of the driving power line PL overlapped with the active layer A2 of the second thin film transistor TR2 may be referred to as the second drain electrode D2.

Referring to FIGS. 12 and 13, a second capacitor electrode C12, a first bridge BR1 and a second bridge BR2 of the first capacitor C1 are disposed on the interlayer insulating layer 180.

The second capacitor electrode C12 overlaps the first capacitor electrode C11 to form the first capacitor C1.

The first bridge BR1 may be integrally formed with the second capacitor electrode C12. The first bridge BR1 is connected to the light shielding layer 111 through a second contact hole H2, and is connected to the second source electrode S2 through a third contact hole H3. As a result, the light shielding layer 111 may be connected to the second source electrode S2 of the second thin film transistor TR2.

The second bridge BR2 is connected to the gate electrode G2 of the second thin film transistor TR2 through a fourth contact hole H4, and is connected to the first capacitor electrode C11 of the first capacitor C1 through a seventh contact hole H7.

Also, referring to FIG. 12, a third bridge BR3 is disposed on the interlayer insulating layer 180. The third bridge BR3 is connected to the gate line GL through an eighth contact hole H8 and thus connected to the gate electrode G1, and is connected to the light shielding layer 111 of the first thin film transistor TR1 through a ninth contact hole H9. Although FIG. 12 illustrates that the light shielding layer 111 is connected to the gate electrode G1, one embodiment of the present disclosure is not limited thereto, and the light shielding layer 111 may be also connected to the first source electrode S1 or the first drain electrode D1.

A planarization layer 175 is disposed on the data line DL, the driving power line PL, the second capacitor electrode C12, the first bridge BR1, the second bridge BR2, and the third bridge BR3. The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 is in contact with the second capacitor electrode C12 integrally formed with the first bridge BR1 through a sixth contact hole H6 formed in the planarization layer 175. As a result, the first electrode 711 may be connected to the second source electrode S2 of the second thin film transistor TR2.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 13 is an organic light emitting diode (OLED). Therefore, the display device 900 according to one embodiment of the present disclosure is an organic light emitting display device.

Figure 14:
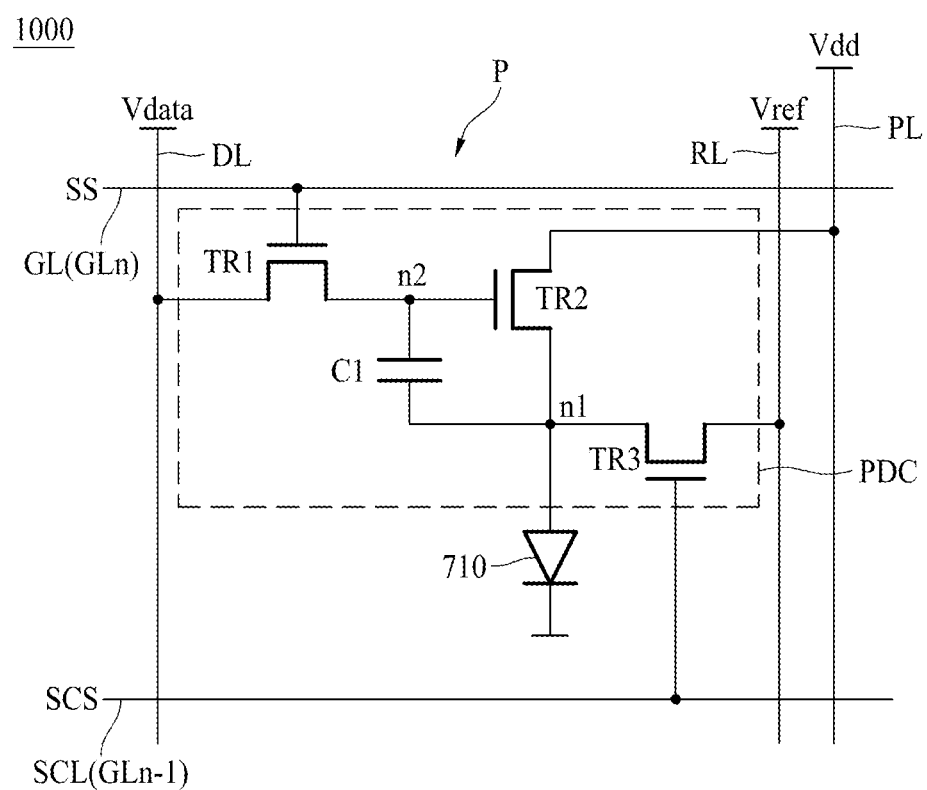
FIG. 14 is a circuit view illustrating any one pixel of a display device according to another example of the present disclosure.

FIG. 14 is a circuit view illustrating any one pixel P of a display device 1000 according to further still another embodiment of the present disclosure. FIG. 14 is an equivalent circuit view illustrating a pixel P of an organic light emitting display device.

The pixel P of the display device 1000 shown in FIG. 14 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 14, assuming that a gate line of an (n)th pixel P is "$GL_n$," a gate line of a (n−1)th pixel P adjacent to the (n)th pixel P is "$GL_{n-1}$," and the gate line "$GL_{n-1}$" of the (n−1)th pixel P serves as a sensing control line SCL of the (n)th pixel P.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (reference transistor) for sensing characteristics of the second thin film transistor TR2.

A first capacitor C1 is positioned between a gate electrode G2 of the second thin film transistor TR2 and the display element 710. The first capacitor C1 is referred to as a storage capacitor Cst.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period.

A second node n2 connected with the gate electrode G2 of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode G2 of the second thin film transistor TR2. The data voltage Vdata is charged in the first capacitor C1 formed between the gate electrode G2 and the source electrode S2 of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

Figure 15:
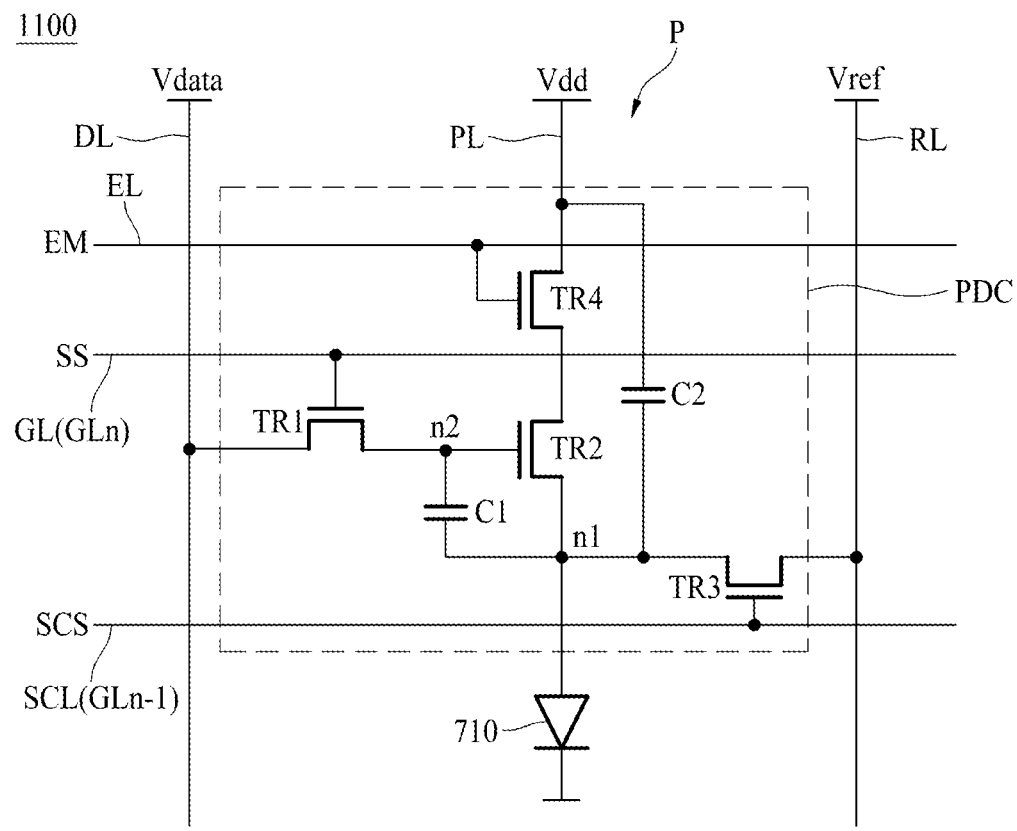
FIG. 15 is a circuit view illustrating any one pixel of a display device according to another example of the present disclosure.

FIG. 15 is a circuit view illustrating a pixel of a display device 1100 according to further still another embodiment of the present disclosure.

The pixel P of the display device 1100 shown in FIG. 15 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 14, the pixel P of FIG. 15 further includes an emission control line EL. An emission control signal EM is supplied to the emission control line EL.

Also, the pixel driving circuit PDC of FIG. 15 further includes a fourth thin film transistor TR4 that is an emission control transistor for controlling a light emission timing of the second thin film transistor TR2, in comparison with the pixel driving circuit PDC of FIG. 14.

Referring to FIG. 15, assuming that a gate line of an (n)th pixel P is "$GL_n$," a gate line of a (n−1)th pixel P adjacent to the (n)th pixel P is "$GL_{n-1}$" and the gate line "$GL_{n-1}$" of the (n−1)th pixel P serves as a sensing control line SCL of the (n)th pixel P.

A first capacitor C1 is positioned between the gate electrode G2 of the second thin film transistor TR2 and the display element 710. A second capacitor C2 is positioned between one of terminals of the fourth thin film transistor TR4, to which a driving voltage Vdd is supplied, and one electrode of the display element 710.

The first thin film transistor TR1 is turned on by the scan signal SS supplied to the gate line GL to transmit the data voltage Vdata, which is supplied to the data line DL, to the gate electrode G2 of the second thin film transistor TR2.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor TR4 is turned on, a current is supplied to the second thin film transistor TR2, whereby light is output from the display element 710.

The pixel driving circuit PDC according to further still another embodiment of the present disclosure may be formed in various structures in addition to the structure described herein. The pixel driving circuit PDC may include, for example, five or more thin film transistors.

According to the present disclosure, the following advantageous effects may be obtained.

The thin film transistor according to one embodiment of the present disclosure has a large s-factor and at the same time has excellent ON-current characteristics.

The thin film transistor according to one embodiment of the present disclosure is designed such that the length of the second channel area of the channel portion is greater than that of the first channel area, thereby having a large s-factor.

The thin film transistor according to one embodiment of the present disclosure is designed such that the length of the first channel area of the channel portion is smaller than that of the second channel area, thereby having excellent ON-current characteristics.

The display device comprising the thin film transistor according to one embodiment of the present disclosure may have excellent gray scale expression capability and excellent current characteristics.

It will be apparent to those skilled in the art that the present disclosure is not limited by the embodiments described herein and the accompanying drawings and that various substitutions, modifications and variations can be made in the present disclosure without departing from the scope of the disclosures. It is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin film transistor comprising:
an active layer; and
a gate electrode at least partially overlapped with the active layer,
wherein the active layer includes:
  a channel portion overlapped with the gate electrode;
  a first connection portion that is in contact with a first side of the channel portion; and
  a second connection portion that is in contact with a second side of the channel portion,
wherein:
  the channel portion includes a first channel area and a second channel area,
  each of the first channel area and the second channel area extends from the first connection portion to the second connection portion, and
  a length of the first channel area is shorter than a length of the second channel area in a direction between the first connection portion and the second connection portion,
wherein the active layer includes:
  a first active layer including the first channel area; and
  a second active layer including the second channel area,
wherein the first active layer and the second active layer are disposed in a same layer, and are spaced apart from each other in an area overlapping the gate electrode.

2. The thin film transistor of claim 1, wherein the gate electrode has a width that changes in a stepwise manner at a boundary between the first channel area and the second channel area.

3. The thin film transistor of claim 1, wherein the gate electrode has a width that changes in stepwise manner between the first channel area and the second channel area.

4. The thin film transistor of claim 1, wherein the gate electrode has a width that gradually changes along a direction from the first channel area to the second channel area.

5. The thin film transistor of claim 1, wherein the gate electrode overlaps each of the first channel area and the second channel area, a width of the gate electrode that overlaps the first channel area smaller than a width of the gate electrode that overlaps the second channel area.

6. The thin film transistor of claim 5, wherein a first portion of the gate electrode overlapped with the first channel area and a second portion of the gate electrode overlapped with the second channel area are integrally formed.

7. The thin film transistor of claim 1, further comprising:
a vacant area in the active layer, wherein the active layer surrounds the vacant area in a plan view.

8. The thin film transistor of claim 7, wherein the active layer is not disposed in the vacant area.

9. The thin film transistor of claim 1, wherein the active layer includes an oxide semiconductor material.

10. The thin film transistor of claim 9, wherein the oxide semiconductor material includes at least one of an IZO (InZnO)-based, an IGO(InGaO)-based, an ITO(InSnO)-based, an IGZO(InGaZnO)-based, an IGZTO(InGaZnSnO)-based, a GZTO(GaZnSnO)-based, a GZO(GaZnO)-based, an ITZO(InSnZnO)-based or a FIZO(FeInZnO)-based oxide semiconductor material.

11. The thin film transistor of claim 1, wherein the active layer includes:
a first oxide semiconductor layer; and a second oxide semiconductor layer on the first oxide semiconductor layer.

12. The thin film transistor of claim 11, wherein the active layer further includes a third oxide semiconductor layer on the second oxide semiconductor layer.

13. A display device comprising:
a display element; and
a pixel driving circuit for driving the display element, the pixel driving circuit includes a first thin film transistor, wherein the thin film transistor comprises:
an active layer; and
a gate electrode at least partially overlapped with the active layer,
the active layer including:
a channel portion overlapped with the gate electrode;
a first connection portion that is in contact with a first side of the channel portion; and
a second connection portion that is in contact with a second side of the channel portion,
the channel portion including a first channel area and a second channel area, each of the first channel area and the second channel area extending from the first connection portion to the second connection portion, and a length of the first channel area shorter than a length of the second channel area in a direction between the first connection portion and the second connection portion,
wherein the active layer includes:
a first active layer including the first channel area; and
a second active layer including the second channel area,
wherein the first active layer and the second active layer are disposed in a same layer, and are spaced apart from each other.

14. The display device of claim 13, wherein the gate electrode overlaps each of the first channel area and the second channel area, a width of the gate electrode that overlaps the first channel area smaller than a width of the gate electrode that overlaps the second channel area.

15. The display device of claim 14, wherein a first portion of the gate electrode overlapped with the first channel area and a second portion of the gate electrode overlapped with the second channel area are integrally formed.

* * * * *